United States Patent
James et al.

(10) Patent No.: US 10,451,295 B2
(45) Date of Patent: Oct. 22, 2019

(54) EQUIPMENT ENCLOSURE WITH MULTI-MODE TEMPERATURE CONTROL SYSTEM

(71) Applicant: Diversified Control, Inc., Orchard Park, NY (US)

(72) Inventors: Brent A. James, Orchard Park, NY (US); Lewis G. James, Clarence, NY (US); Aron J. King, Alden, NY (US)

(73) Assignee: Diversified Control, Inc., Orchard Park, NY (US)

( * ) Notice: Subject to any disclaimer, the term of this patent is extended or adjusted under 35 U.S.C. 154(b) by 572 days.

(21) Appl. No.: 14/628,934

(22) Filed: Feb. 23, 2015

(65) Prior Publication Data
US 2016/0178223 A1     Jun. 23, 2016

Related U.S. Application Data

(60) Provisional application No. 62/095,590, filed on Dec. 22, 2014.

(51) Int. Cl.
*F24F 1/022*     (2019.01)
*F24F 13/14*    (2006.01)
(Continued)

(52) U.S. Cl.
CPC .......... *F24F 1/022* (2013.01); *F24F 11/0001* (2013.01); *F24F 11/30* (2018.01); *F24F 11/74* (2018.01); *F24F 11/77* (2018.01); *F24F 13/14* (2013.01); *F24F 2011/0002* (2013.01); *F24F 2011/0006* (2013.01); *F24F 2110/00* (2018.01); *F24F 2110/10* (2018.01); *F24F 2110/12* (2018.01); *F24F 2140/60* (2018.01)

(58) Field of Classification Search
CPC ...... F24F 11/001; F24F 1/022; F24F 11/0001; F24F 11/0012; F24F 11/0079; F24F 11/04; F24F 13/14; F24F 11/77; F24F 11/74; F24F 11/30; F24F 2140/60; F24F 2110/00; F24F 2110/10; F24F 2110/12; F24F 2011/0002; F24F 2011/0006
USPC .................................................. 165/250, 47
See application file for complete search history.

(56) References Cited

U.S. PATENT DOCUMENTS

| 4,338,996 A | 7/1982 | Frank |
| 4,386,651 A | 6/1983 | Reinhard |

(Continued)

OTHER PUBLICATIONS

Dantherm Heat Management Systems, "Indoor/Outdoor Heat Exchangers", Jan. 1, 2008, 2 pages.

*Primary Examiner* — Raheena R Malik
(74) *Attorney, Agent, or Firm* — Walter W. Duft

(57) ABSTRACT

An equipment enclosure with temperature control components, an equipment enclosure temperature control unit, an equipment enclosure temperature control method, and various modular temperature control subassemblies are respectively disclosed for controlling the temperature of equipment in an equipment chamber. The temperature control components and unit may be implemented with a modular design wherein an air-conditioning unit is selectively mountable on an air handler assembly. The temperature control components and unit may support air-conditioning, free-air-cooling, free-air-cooling-with-return, and heating modes of operation. An emergency-free-air-cooling mode of operation may also be supported.

24 Claims, 25 Drawing Sheets

(51) Int. Cl.
*F24F 11/00* (2018.01)
*F24F 11/30* (2018.01)
*F24F 11/77* (2018.01)
*F24F 11/74* (2018.01)
*F24F 110/00* (2018.01)
*F24F 110/10* (2018.01)
*F24F 110/12* (2018.01)
*F24F 140/60* (2018.01)

(56) References Cited

U.S. PATENT DOCUMENTS

| | | | |
|---|---|---|---|
| 4,449,579 A | 5/1984 | Miyazaki et al. | |
| 4,537,035 A * | 8/1985 | Stiles | F24F 1/022 |
| | | | 165/250 |
| 5,485,878 A * | 1/1996 | Derks | F24F 3/044 |
| | | | 165/137 |
| 5,738,166 A | 4/1998 | Chou | |
| 5,765,743 A | 6/1998 | Sakiura et al. | |
| 5,832,988 A | 11/1998 | Mistry et al. | |
| 5,886,296 A | 3/1999 | Chorbani et al. | |
| 5,934,368 A | 8/1999 | Tanaka et al. | |
| 6,026,891 A | 2/2000 | Fujiyoshi et al. | |
| 6,041,851 A | 3/2000 | Diebel et al. | |
| 6,067,223 A | 5/2000 | Diebel et al. | |
| 6,105,875 A | 8/2000 | LaGrotta et al. | |
| 6,119,768 A | 9/2000 | Dreier et al. | |
| 6,123,266 A | 9/2000 | Bainbridge et al. | |
| 6,127,663 A | 10/2000 | Jones | |
| 6,164,369 A | 12/2000 | Stoller | |
| 6,407,533 B1 | 6/2002 | Bartek et al. | |
| 6,435,211 B2 * | 8/2002 | Stone | F16K 17/383 |
| | | | 137/601.12 |
| 6,533,031 B1 | 3/2003 | Garcia et al. | |
| 6,579,168 B1 | 6/2003 | Webster et al. | |
| 6,598,668 B1 | 7/2003 | Cosley et al. | |
| 6,628,520 B2 | 9/2003 | Patel et al. | |
| 6,700,780 B2 | 3/2004 | Hedberg et al. | |
| 6,704,198 B2 | 3/2004 | Replogle et al. | |
| 6,742,583 B2 | 6/2004 | Tikka | |
| 6,804,975 B2 * | 10/2004 | Park | F24F 1/022 |
| | | | 62/187 |
| 6,877,551 B2 | 4/2005 | Stoller | |
| 6,885,554 B1 | 4/2005 | Reeck et al. | |
| 6,889,752 B2 | 5/2005 | Stoller | |
| 6,936,372 B1 | 8/2005 | Jagota et al. | |
| 7,007,495 B2 * | 3/2006 | Lee | F24F 3/1423 |
| | | | 62/271 |
| 7,180,738 B2 | 2/2007 | Mandel et al. | |
| 7,222,660 B2 | 5/2007 | Giacoma et al. | |
| 7,263,855 B2 * | 9/2007 | Meyer | F25D 11/003 |
| | | | 62/371 |
| 7,309,279 B2 | 12/2007 | Sharp et al. | |
| 7,312,993 B2 | 12/2007 | Bundza et al. | |
| 7,455,706 B2 | 11/2008 | Latham et al. | |
| 7,630,198 B2 * | 12/2009 | Doll | F04D 25/166 |
| | | | 361/679.49 |
| 7,878,888 B2 * | 2/2011 | Rasmussen | H05K 7/20572 |
| | | | 361/695 |
| 7,929,294 B2 | 4/2011 | Yeh et al. | |
| 7,974,094 B2 | 7/2011 | Hendrix et al. | |
| 8,072,752 B2 | 12/2011 | Wantschik | |
| 8,072,780 B1 | 12/2011 | Roy | |
| 8,251,136 B2 | 8/2012 | Shibata et al. | |
| 8,313,038 B2 | 11/2012 | Therrien et al. | |
| 8,408,356 B2 | 4/2013 | Yamaguchi et al. | |
| 2002/0167797 A1 | 11/2002 | Willers et al. | |
| 2004/0011072 A1 * | 1/2004 | Inoue | F24F 1/022 |
| | | | 62/408 |
| 2007/0289976 A1 | 12/2007 | Meyer et al. | |
| 2008/0055849 A1 | 3/2008 | Lee | |
| 2008/0068798 A1 | 3/2008 | Hendrix et al. | |
| 2008/0112135 A1 | 5/2008 | Kleinecke et al. | |
| 2008/0212286 A1 | 9/2008 | Komatsu | |
| 2008/0239668 A1 | 10/2008 | Hendrix et al. | |
| 2009/0020618 A1 | 1/2009 | Gutierrez et al. | |
| 2009/0311951 A1 | 12/2009 | Walkinshaw | |
| 2010/0206065 A1 | 8/2010 | Hsiao et al. | |
| 2011/0086589 A1 | 4/2011 | Skrepcinski et al. | |
| 2011/0308265 A1 * | 12/2011 | Phannavong | F24F 12/001 |
| | | | 62/160 |
| 2013/0035031 A1 | 2/2013 | Therrien et al. | |
| 2013/0087320 A1 * | 4/2013 | James | H05K 7/20572 |
| | | | 165/253 |
| 2015/0276249 A1 * | 10/2015 | Rasmussen | F24F 11/0001 |
| | | | 454/251 |
| 2017/0016646 A1 * | 1/2017 | Lee | F24F 12/006 |

\* cited by examiner

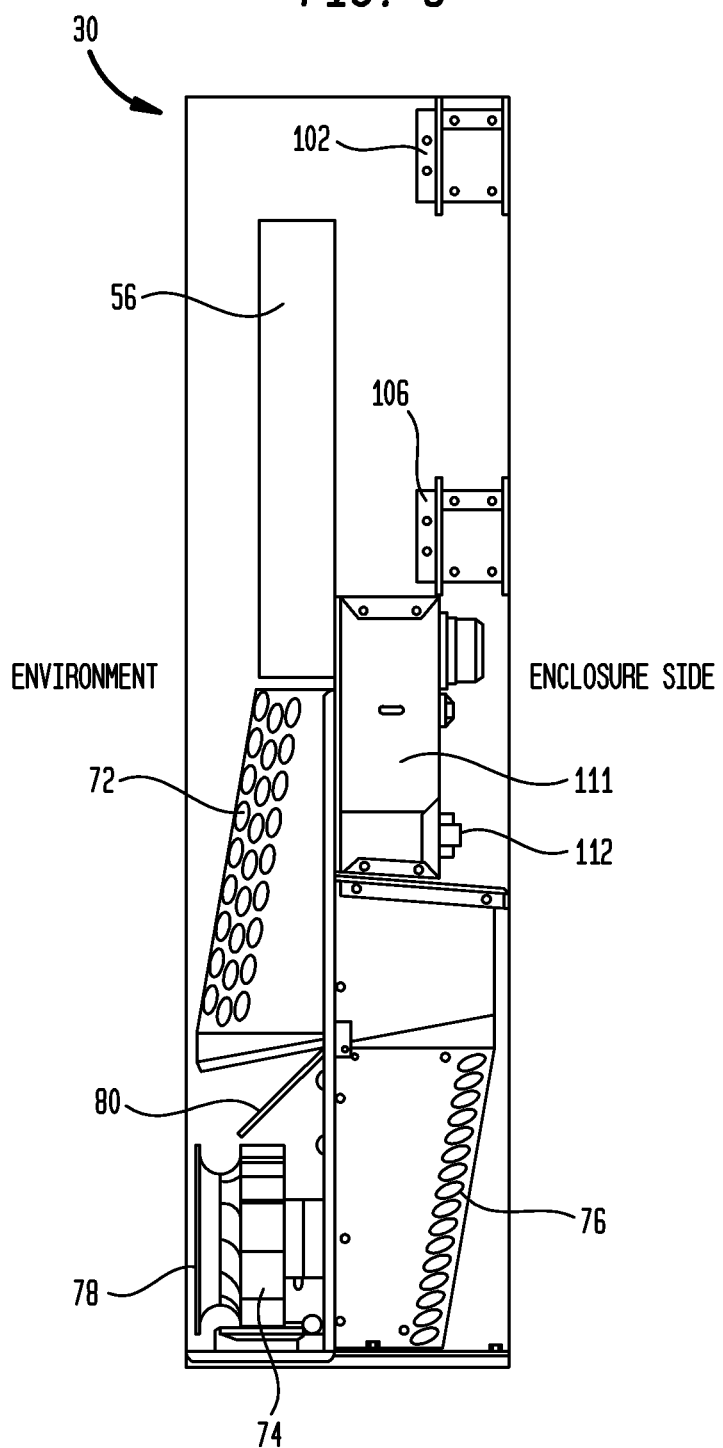

MODE:
AIR CONDITIONING

MODE:
FREE AIR CONDITIONING

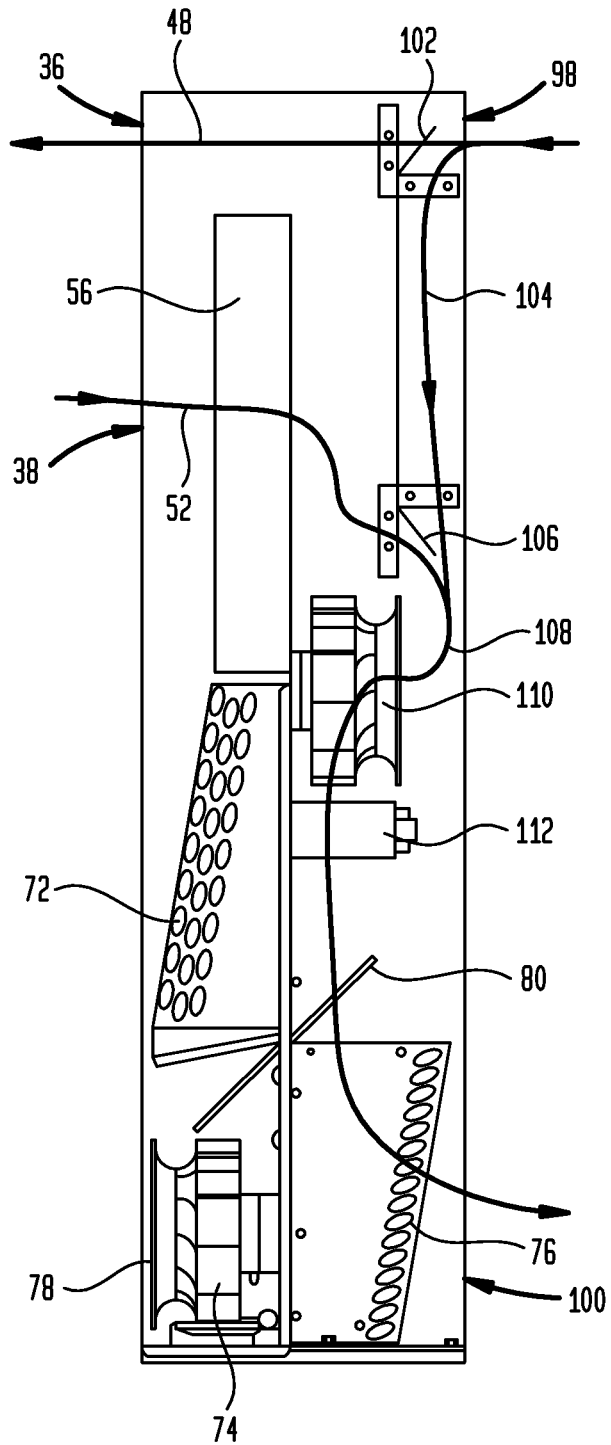

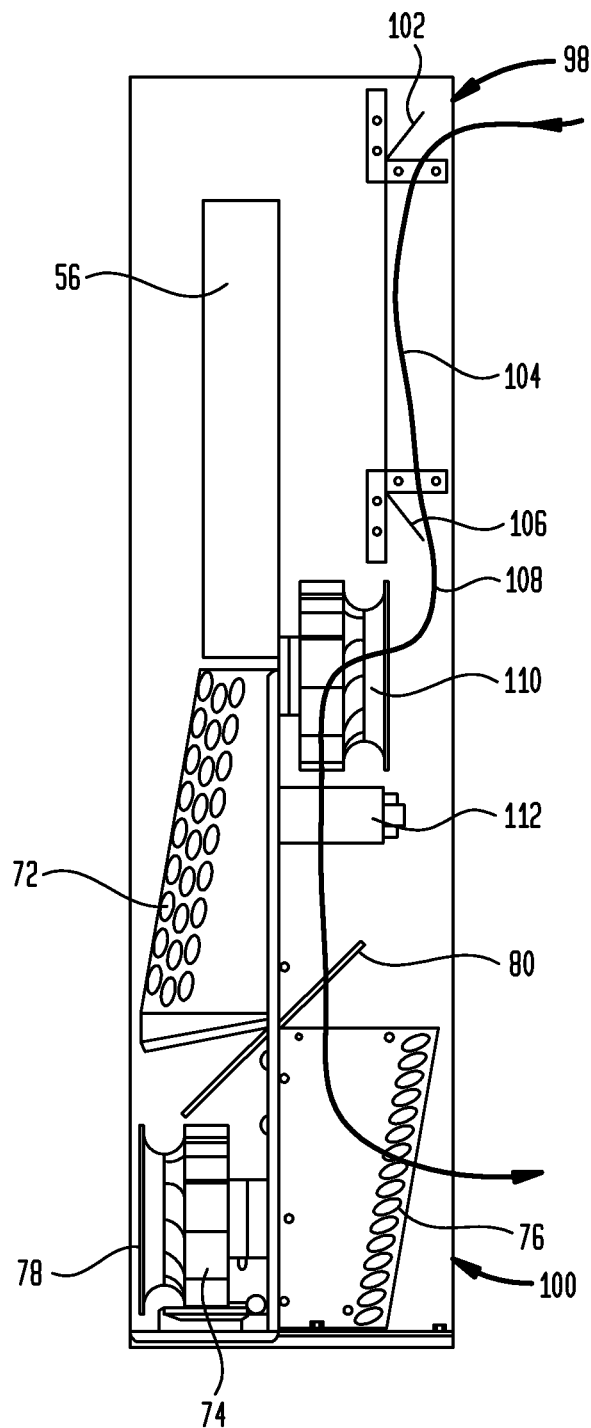

MODE:
EMERGENCY
FREE AIR CONDITIONING

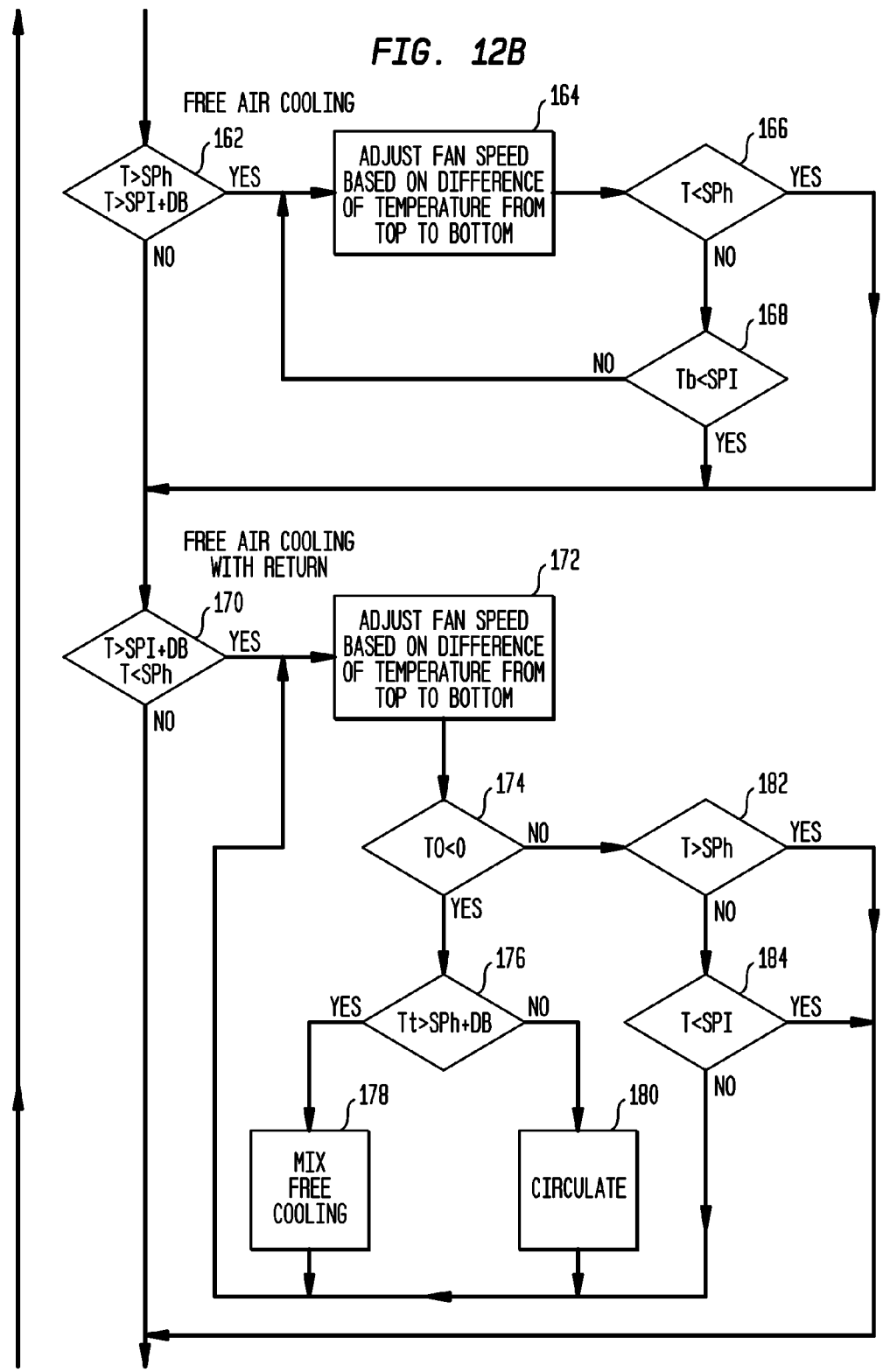

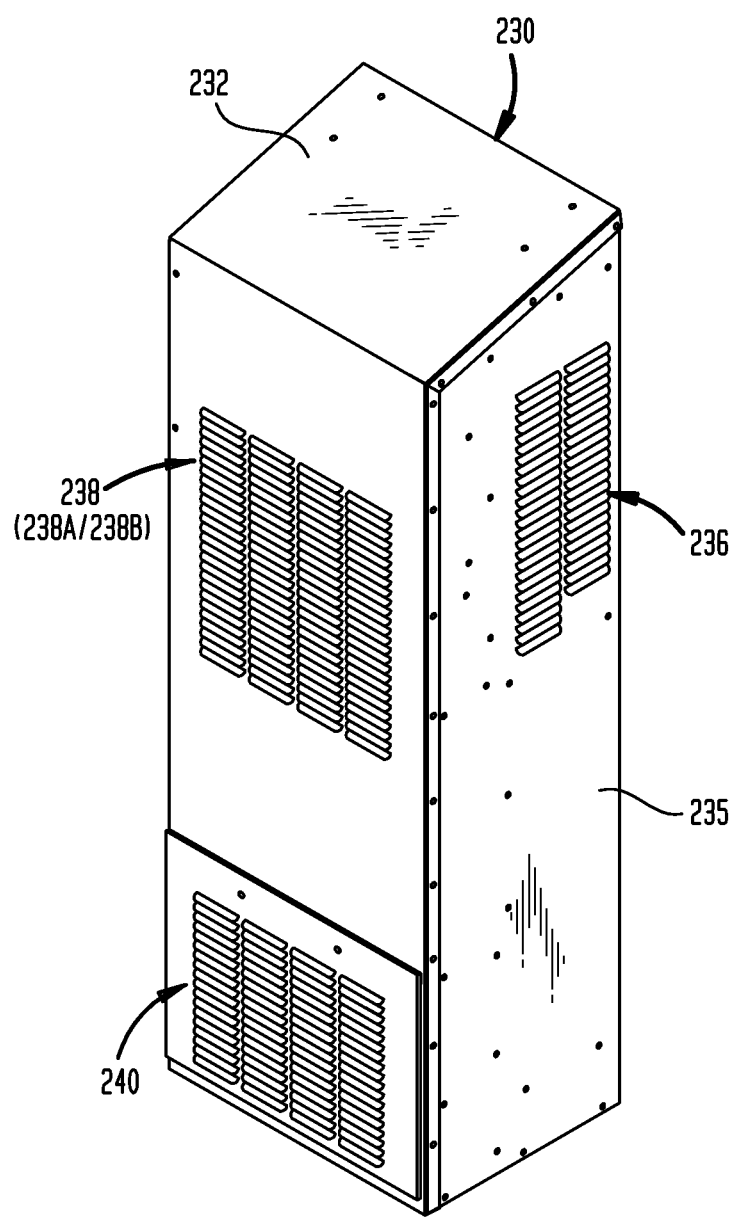

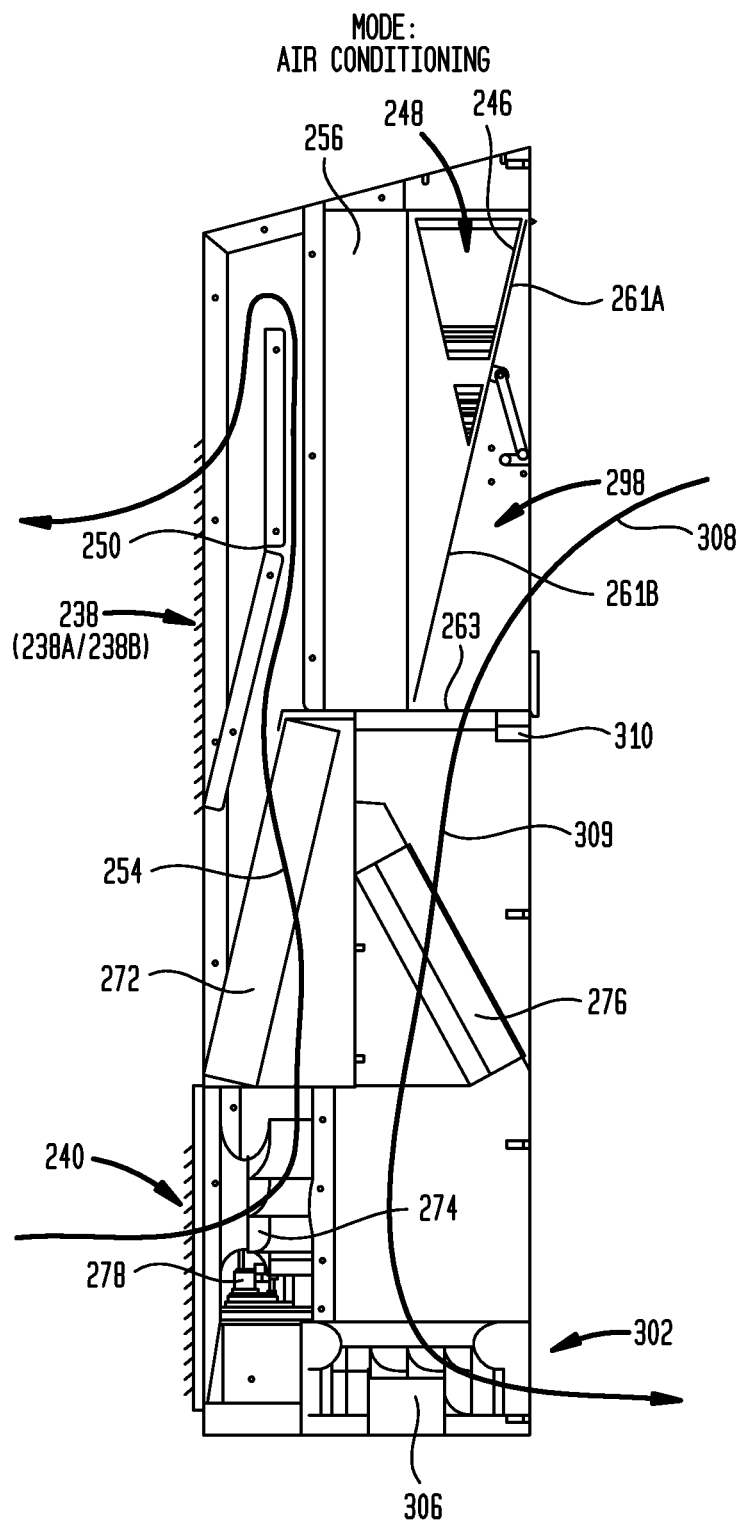

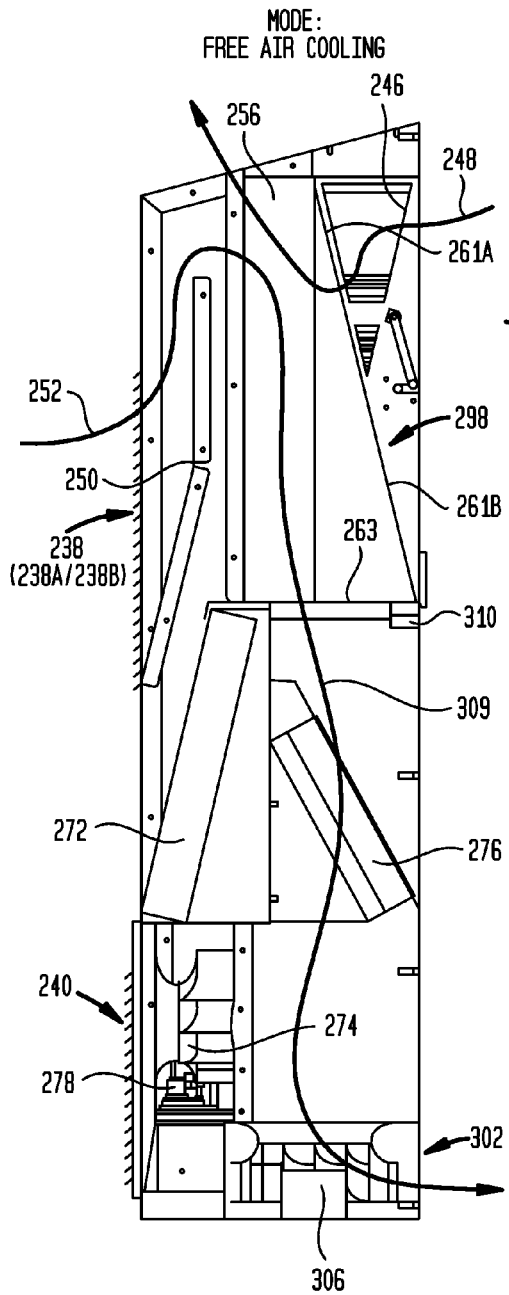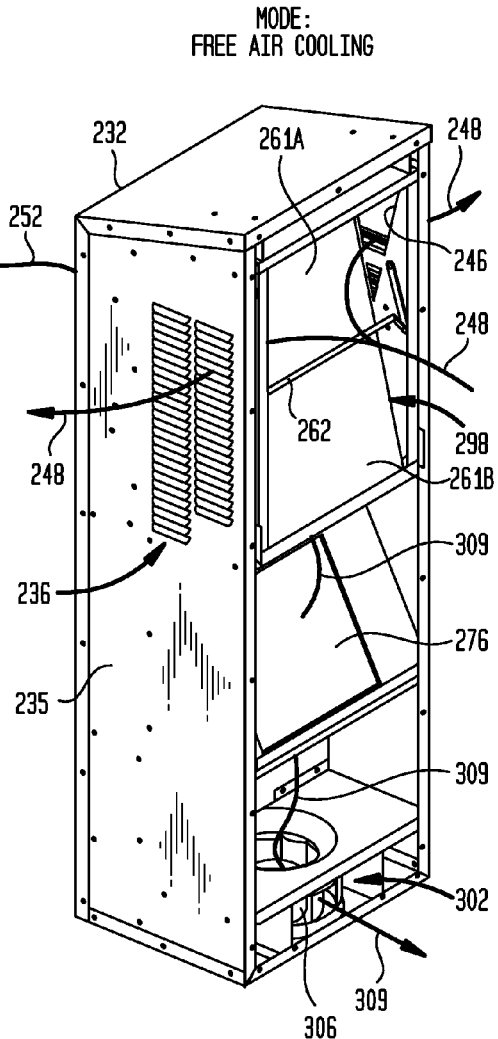

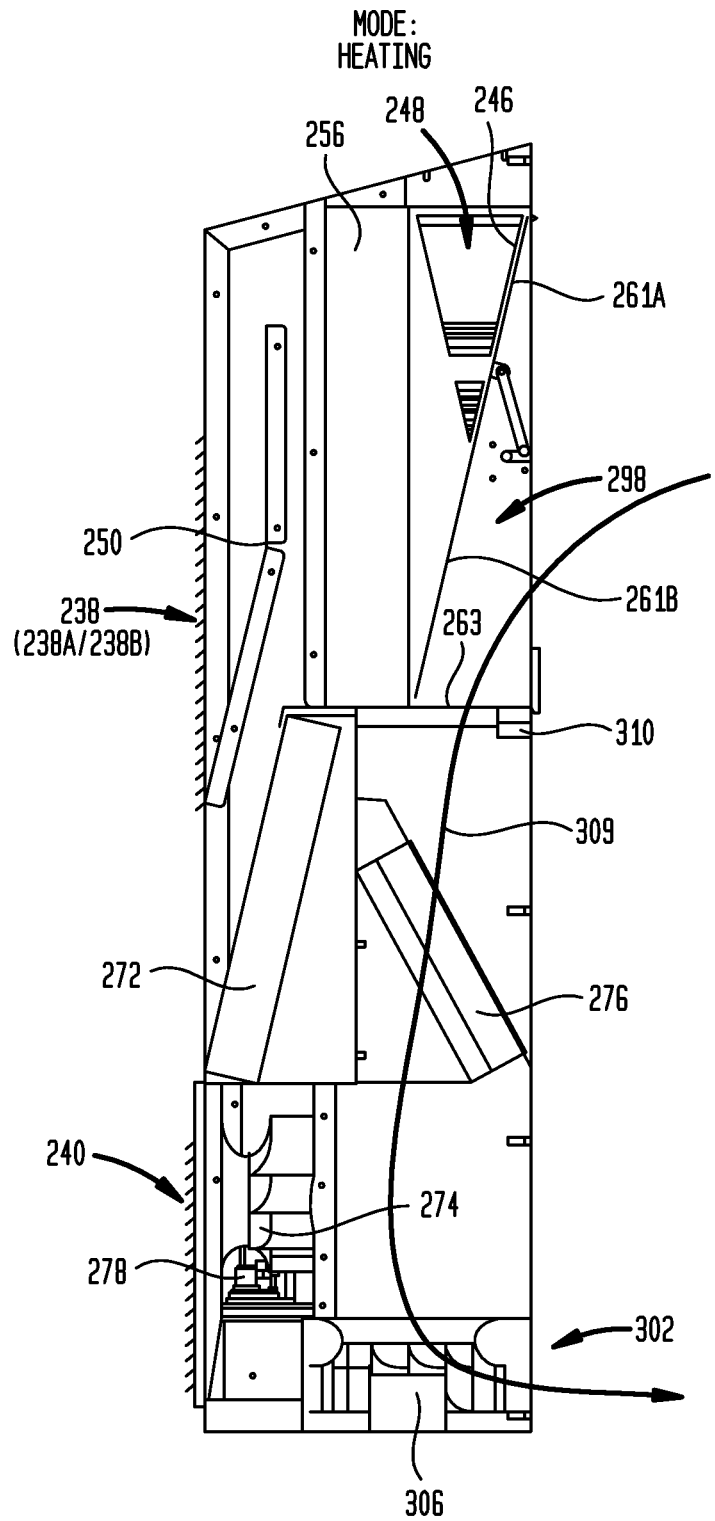

EQUIPMENT ENCLOSURE WITH MULTI-MODE TEMPERATURE CONTROL SYSTEM

BACKGROUND

1. Field of the Disclosure

The present disclosure relates to equipment enclosures. More particularly, the disclosure concerns enclosures with temperature control apparatus for maintaining temperature controlled equipment within a desired temperature range despite fluctuations in environmental temperature conditions outside the enclosure.

2. Description of the Prior Art

By way of background, equipment enclosures are often used to house temperature controlled equipment that is designed to operate most efficiently within a prescribed temperature range. Examples include, but are not limited to, enclosures for cellular communications equipment and other apparatus. Such equipment enclosures usually include some type of temperature control functionality in order to provide cooling in hot weather and heating in cold weather. Existing temperature control solutions range from simple fans to complex air conditioning and heating units. Fan systems are inexpensive and have low power demand, but often provide inadequate temperature control. Air conditioning and heating units provide superior temperature control, but are comparatively expensive and have high power demand. It is to improvements in equipment enclosure temperature control that the present disclosure is directed. In particular, the disclosure presents a novel equipment enclosure and temperature control system that is superior to existing fan devices while requiring substantially less power than conventional air conditioning and heating units.

SUMMARY

An equipment enclosure with temperature control components, an equipment enclosure temperature control unit, an equipment enclosure temperature control method, and various modular temperature control subassemblies are respectively disclosed for controlling the temperature of equipment in an equipment chamber. The equipment enclosure is one that includes a temperature-controlled equipment chamber for housing equipment in said equipment enclosure.

In an example embodiment, the temperature control components and unit may include:

(1) an inside air inlet arranged to receive air from the equipment chamber;
(2) an inside air outlet arranged to deliver air to the equipment chamber;
(3) first and second outside air outlets arranged to deliver air to outside the equipment enclosure;
(4) first and second outside air inlets arranged to deliver air to outside the equipment enclosure;
(5) an interior air exhaust pathway extending between the inside air inlet and the first outside air outlet for venting interior air in the interior equipment chamber to outside the enclosure;
(6) an interior air return pathway extending between the inside air inlet and the inside air outlet for recirculating interior air in the interior equipment chamber;
(7) a first controllable damper operable to selectively communicate air from the inside air inlet to the air exhaust pathway and the interior air return pathway;
(8) a fresh air inlet pathway extending between the first outside air inlet and the inside air outlet;
(9) a second controllable damper operable to selectively communicate air from the interior air return pathway and the fresh air inlet pathway to the inside air outlet;
(10) a primary air mover disposed to move air through the interior air return pathway and the fresh air inlet pathway;
(11) an air heater in the interior air return pathway;
(12) an air conditioning evaporator in the interior air return pathway;
(13) an air conditioning warm air vent pathway extending between the second outside air inlet and the second outside air outlet;
(14) an air conditioning condenser in the air conditioning warm air vent pathway;
(15) a variable speed air conditioning compressor operably connected to pump a coolant through a coolant loop that includes the air conditioning condenser and the air conditioning evaporator;
(16) an air conditioning air mover disposed to move air through the air conditioning warm air vent pathway;
(17) upper and low temperature sensors for sensing temperature in upper and lower portions of the equipment chamber;
(18) an outside air temperature sensor for sensing outside air temperature; and
(19) a temperature controller operable to control the dampers, the air movers and the air conditioning compressor based on temperature readings provided by the temperature sensors.

In an example embodiment, the temperature control components or unit are mounted on a wall or door of the equipment enclosure.

In an example embodiment, the temperature control unit includes a modular air conditioning unit that is selectively attachable to a modular temperature control unit air handler assembly. In this embodiment, the air conditioning unit may comprise the air conditioning evaporator, the air conditioning condenser, the variable speed air conditioning compressor, the air conditioning air mover, a first portion of the air conditioning warm air vent pathway, and a first portion of the interior air return pathway. The air handler assembly may comprise a second portion of the interior air return pathway, the first controllable damper, the fresh air inlet pathway, the second controllable damper, the primary air mover, the air heater, and a second portion of the air conditioning warm air vent pathway. The inside air inlet and the inside air outlet may include an inside cover on the air handler assembly. The first outside air outlet, the second outside air inlet, and the first outside air inlet may include an outside cover on the air handler assembly.

The temperature control components and unit may be implemented to support air-conditioning, free-air-cooling, and heating modes of operation. The temperature control components and unit may further support free-air-cooling-with-return and emergency-free-air-cooling modes of operation.

In the air-conditioning mode of operation, warm air is drawn from an upper portion of the equipment chamber by the primary air mover and circulated through the air conditioning evaporator, where it is cooled, and then discharged into a lower portion of the equipment chamber.

In the free-air-cooling mode of operation, warm air is received from an upper portion of the equipment chamber and discharged outside the equipment chamber. At the same time, fresh air is drawn from outside the equipment chamber by the primary air mover and discharged into a lower portion of the equipment chamber.

In the heating mode of operation, warm air is drawn from an upper portion of the equipment chamber by the primary air mover and recirculated through the heater, where it is warmed, and then discharged into a lower portion of the equipment chamber.

In the free-air-cooling-with-return mode of operation, warm air is received from an upper portion of the equipment chamber. Some of the warm air is discharged outside the equipment chamber. The remaining warm air is recirculated and mixed with fresh air drawn by the primary air mover from outside the equipment chamber, and the mixture is discharged into a lower portion of the equipment chamber.

In the emergency-free-air-cooling mode of operation, warm air is received from an upper portion of the equipment chamber and discharged outside the equipment chamber. At the same time, fresh air is drawn from outside the equipment chamber and discharged into a lower portion of the equipment chamber. In case the primary air mover is determined to have failed, the air conditioning air mover associated with the air-conditioning unit may be used as a backup air mover.

BRIEF DESCRIPTION OF THE DRAWINGS

The foregoing and other features and advantages will be apparent from the following more particular description of example embodiments, as illustrated in the accompanying Drawings, in which:

FIG. 9 is a diagrammatic side view showing the air handling and mechanical cooling components of FIGS. 7 and 8;

FIG. 10C is a diagrammatic side view of the air handling and mechanical cooling components of FIGS. 7 and 8, showing air flow during a free-air-cooling-with-return mode of operation;

FIG. 10D is a diagrammatic side view of the air handling and mechanical cooling components of FIGS. 7 and 8, showing air flow during a heating mode of operation;

FIG. 12B is the second portion of a flow diagram showing logic for implementing the various modes of operation shown in FIGS. 10A-10E;

FIG. 13 is a front perspective view showing another example temperature control unit that may be mounted on the equipment enclosure of FIG. 1;

FIG. 18A is a cross-sectional centerline view of the air handling and mechanical cooling components of FIGS. 13-16, showing air flow during an air-conditioning mode of operation;

FIG. 18B is a cross-sectional centerline view of the air handling and mechanical cooling components of FIGS. 13-16, showing air flow during a free-air-cooling mode of operation;

FIG. 18C is a rear perspective view of the air handling and mechanical cooling components of FIGS. 13-16, showing air flow during the free-air-cooling mode of operation shown in FIG. 18B; and FIG. 18D is a cross-sectional centerline view of the air handling and mechanical cooling components of FIGS. 13-16, showing air flow during a heating mode of operation.

DETAILED DESCRIPTION OF EXAMPLE EMBODIMENTS

Figure 1:
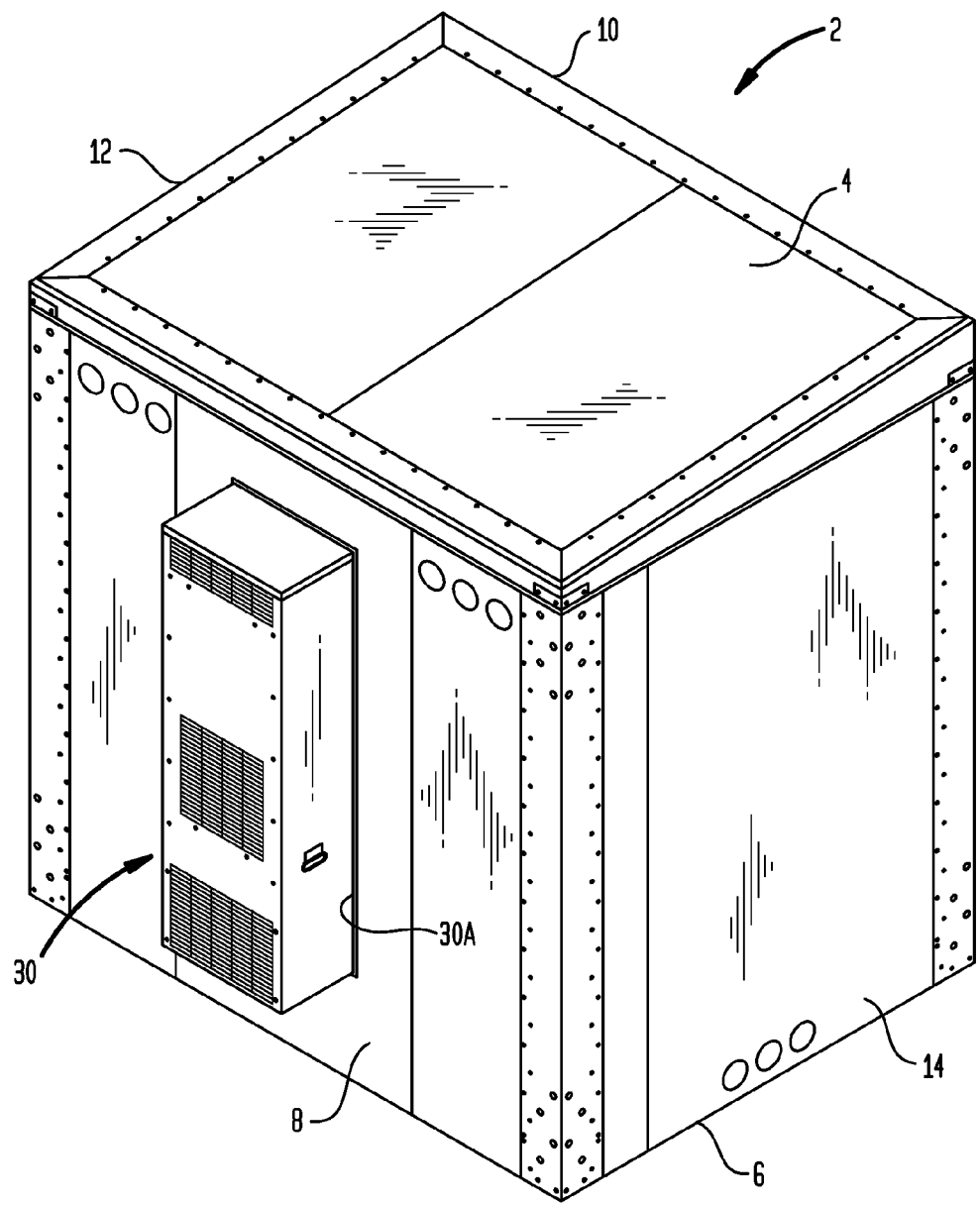
FIG. 1 is a rear perspective view showing an example equipment enclosure that may be constructed according to the present disclosure.
Figure 2:
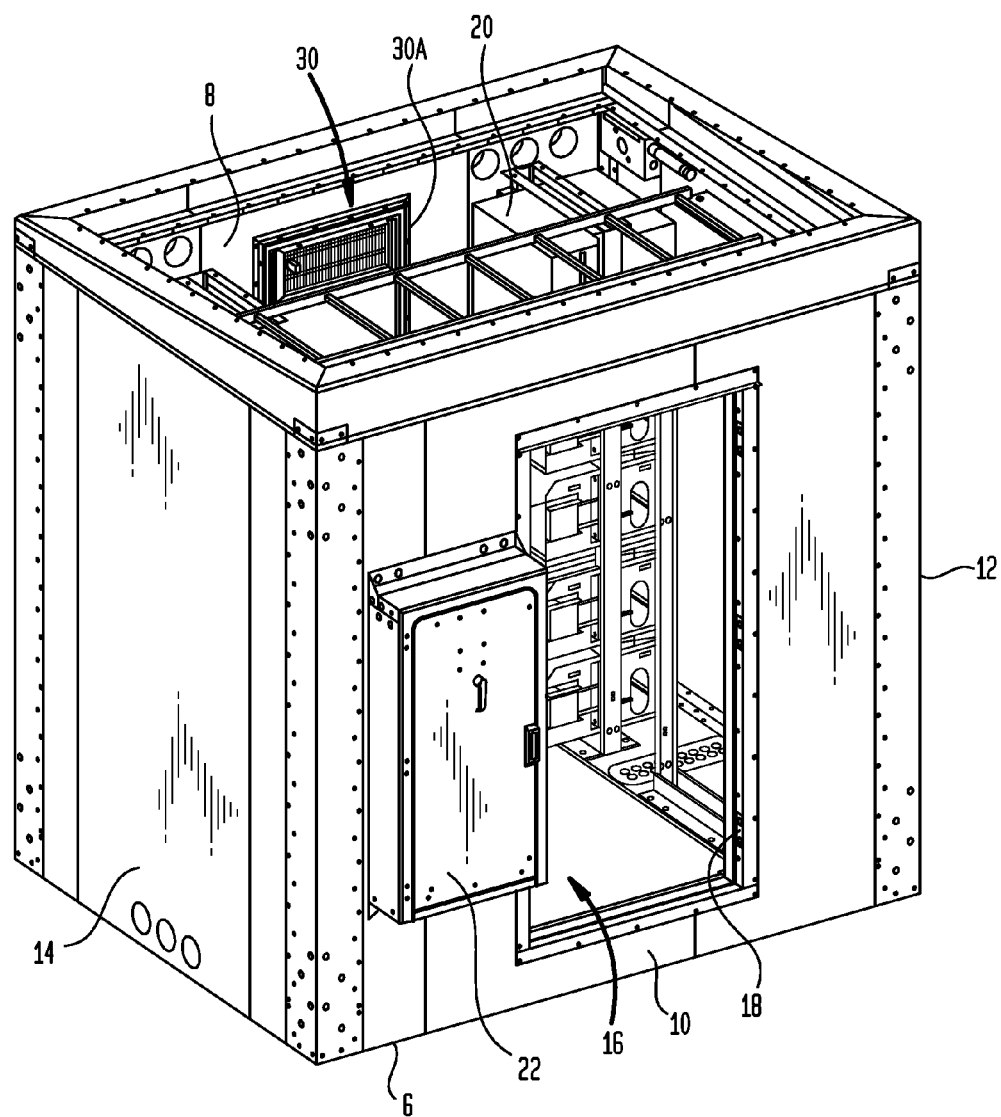
FIG. 2 is a front perspective view showing the equipment enclosure of FIG. 1.

Turning now to the drawing figures, which are not necessarily to scale, like reference numerals are used to represent like elements in all of the several views. FIGS. 1 and 2 illustrate one example embodiment of an equipment enclosure 2 that could be constructed in accordance with the present disclosure. The equipment enclosure 2 may be fabricated from any suitable material, including but not limited to, steel, aluminum, plastic, etc., depending on its intended application. Although the equipment enclosure 2 will typically be used for outdoor applications, it may also be used indoors.

In the illustrated embodiment, the equipment enclosure 2 is designed as a large walk-in unit that is suitable for housing telecommunications equipment, such as may be found at a cellular telephone communications site. However, the size and intended purpose of the equipment enclosure 2 are not pertinent to the present disclosure, and are merely shown for purposes of example only.

As can be seen in FIGS. 1 and 2, the equipment enclosure may be configured with a top panel 4, a bottom panel 6 and four side panels 8 (rear side), 10 (front side), 12 (right side) and 14 (left side) that define an interior equipment chamber 16 (see FIG. 2). FIG. 2 illustrates the equipment enclosure 2 with the top panel 4 removed. It also shows the front side panel 10 having an opening 18 that allows access into the equipment chamber 16. Although not shown, a service door would typically be provided for closing the opening 18 during normal operation. As can be seen by virtue of the removed top panel 4 and the unblocked opening 18, the primary use of the equipment chamber 16 is to house various types of electronic equipment. In FIG. 2, reference number 20 designates one such piece of equipment. Power to the equipment within the equipment chamber 16 may be provided in any suitable manner, such as by way of a power distribution box 22 that is shown in FIG. 2 as being mounted on the outside of the front side panel 10.

Some of the equipment housed within the equipment chamber 16 may be controlled temperature equipment. As used herein, "controlled temperature equipment" refers to any equipment, device or component that is sensitive to temperature and therefore needs to be maintained in a controlled temperature environment. To ensure that the controlled temperature equipment is maintained within a desired temperature range, the equipment enclosure 2 includes a temperature control unit 30 that is shown in FIGS. 1 and 2 as being mounted on the rear side panel 8. In particular, the temperature control unit 30 is fitted in a corresponding opening 30A of the rear side panel 8, so as to provide air communication between the equipment chamber 16 and the ambient environment outside of the equipment enclosure 2. For other types of equipment enclosure, it may be desirable to mount the temperature control unit 30 at some other location, such as on a service door of the enclosure. Thus, the rear side panel mounting location shown in FIGS. 1 and 2 is illustrated for purposes of example only.

Figure 11:
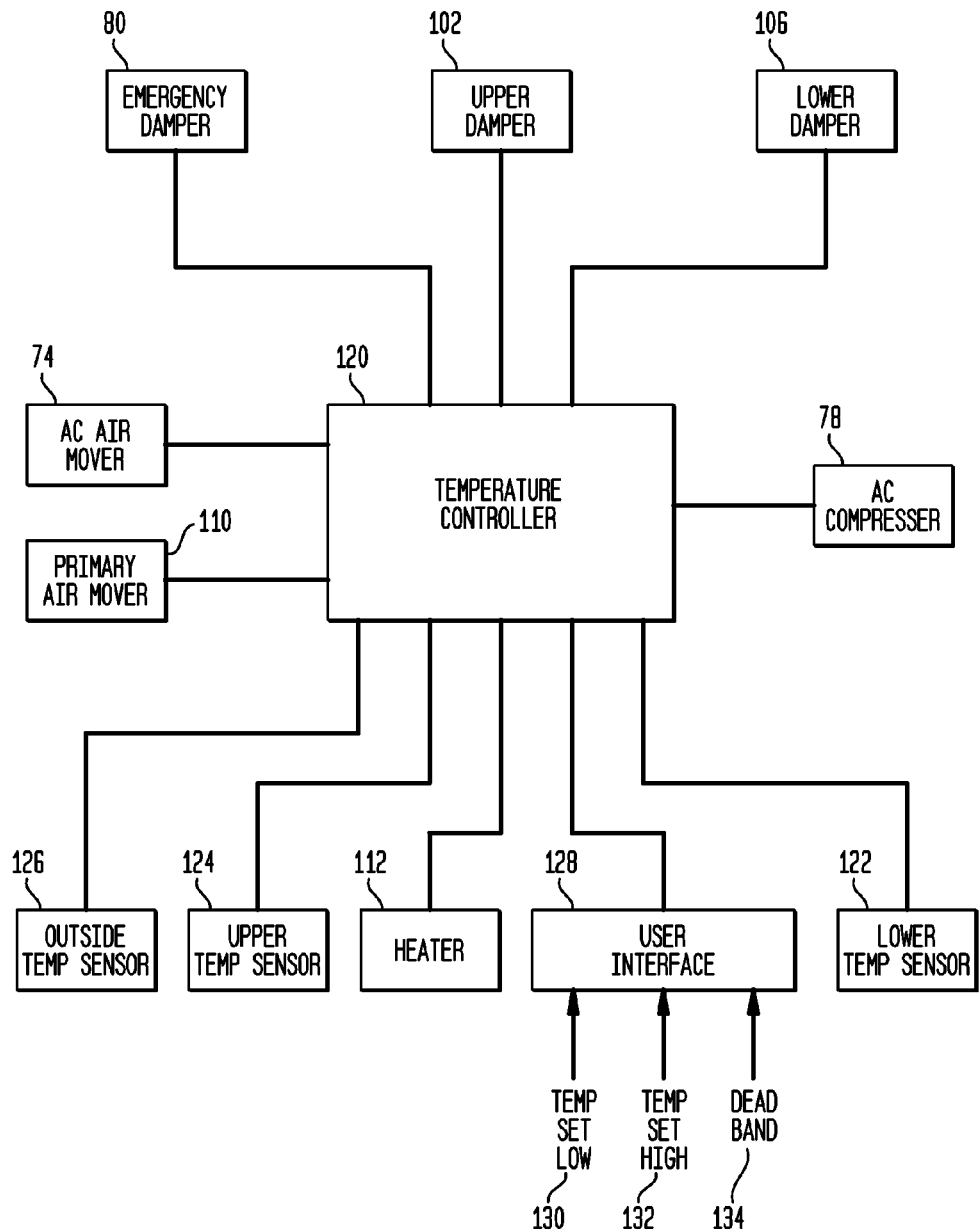
FIG. 11 is a functional block diagram showing control components for implementing the various modes of operation shown in FIGS. 10A-10E.
Figure 12A:
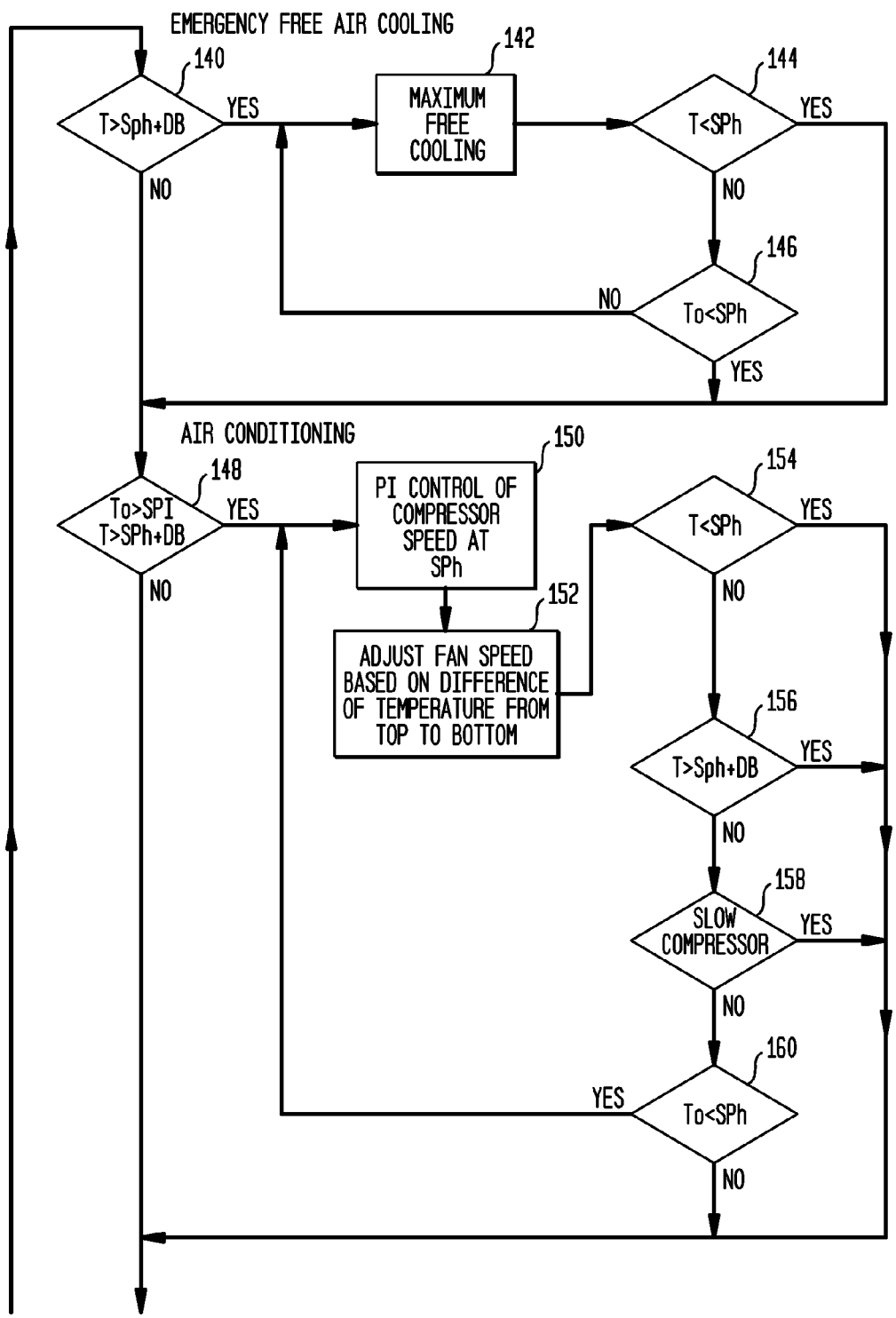
FIG. 12A is the first portion of a flow diagram showing logic for implementing the various modes of operation shown in FIGS. 10A-10E.
Figure 12C:
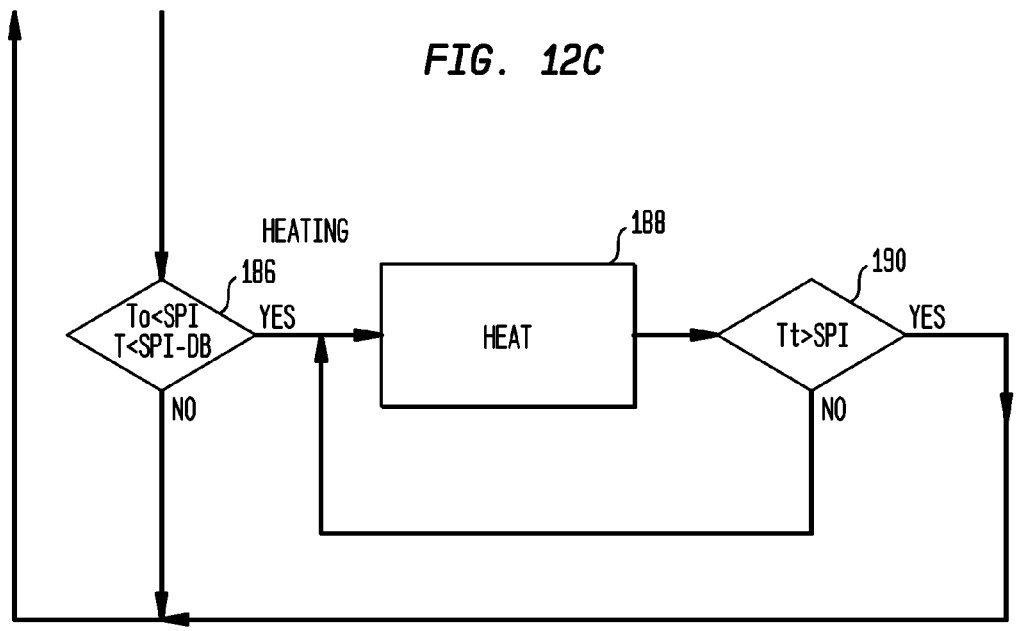
FIG. 12C is the third portion of a flow diagram showing logic for implementing the various modes of operation shown in FIGS. 10A-10E.

The temperature control unit 30 may provide all of the required temperature control components of the equipment chamber 16. Its principal structural features will now be described with reference to the remaining drawing figures, beginning with FIG. 3 and continuing through FIG. 8. FIGS. 9 and 10A-10E are thereafter explored to describe the temperature control unit's various modes of operation. FIG. 11 illustrates functional components for implementing the operational modes of FIGS. 10A-10E. FIGS. 12A-12C illustrate program logic that may be used to implement these modes of operation. Finally, FIGS. 13-18D illustrate an alternate embodiment of a temperature control unit and its various modes of operation.

Advantageously, the temperature control unit 30 forms a self-contained modular portion of the equipment enclosure 2 that can be attached and detached as necessary. By designing the temperature control unit 30 as a modular unit that provides all required temperature control functions required by the equipment enclosure 2, the temperature control unit can be easily replaced in event of failure, or if a new model providing upgraded temperature control functions becomes available. Moreover, the temperature control unit 30 can either be combined with new equipment enclosures, or retrofitted onto older equipment enclosures already in service.

Figure 3:
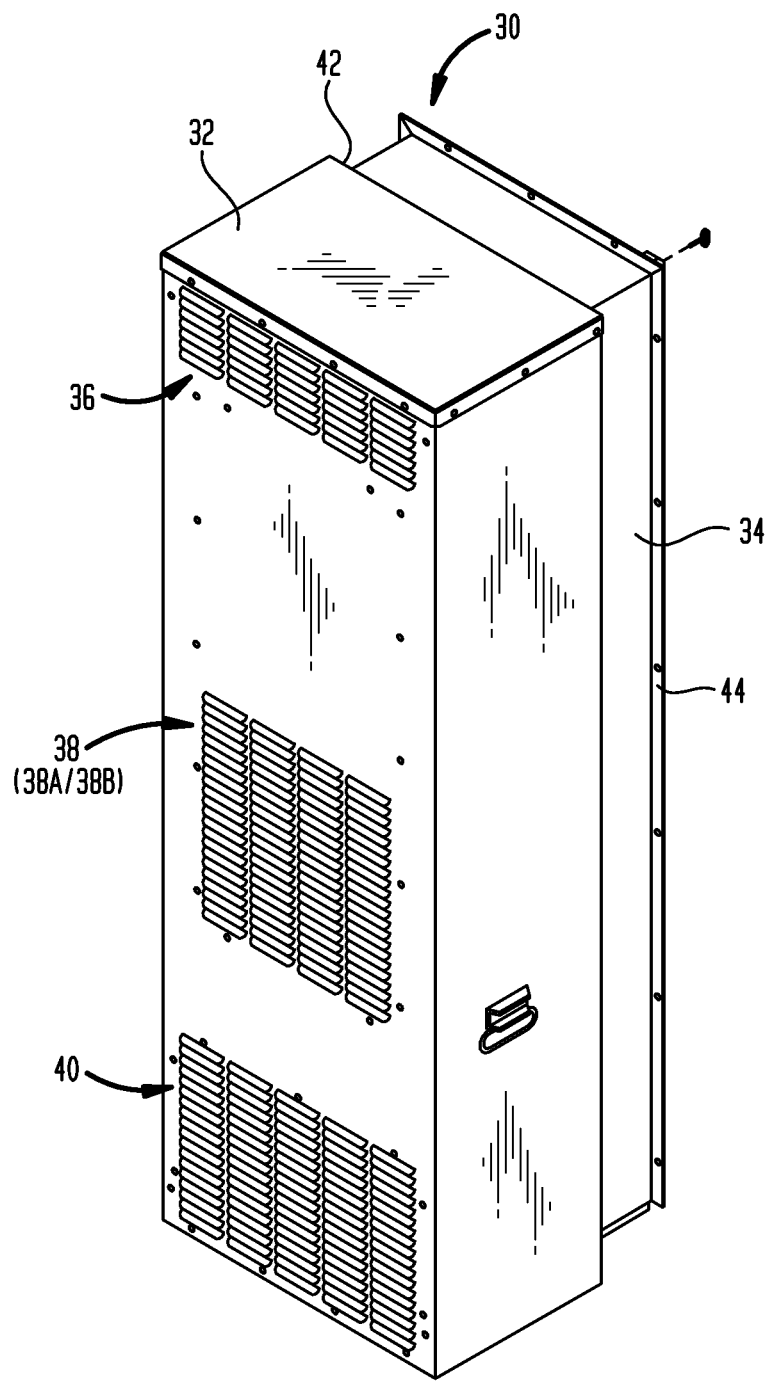
FIG. 3 is a front perspective view showing an example temperature control unit that may be mounted on the equipment enclosure of FIG. 1.

Turning now to FIG. 3, the temperature control unit 30 is shown as having a louvered front cover 32 that is removably mounted on the outer frame of an air handler assembly 34. The front cover 32 has three sets of louvered openings. The upper set of louvered openings provides a first outside air outlet 36 of the temperature control unit 30. As described in more detail below, the outside air outlet 36 is arranged to vent warm air received from the upper portion of the equipment chamber 16 to the ambient environment outside the equipment enclosure 2.

The middle set of louvered openings provides an outside bidirectional air opening 38 of the temperature control unit 30. As described in more detail below, the outside bidirectional air opening 38 is arranged to receive warm air from an air conditioning condenser and vent it outside the equipment enclosure 2, as well as to receive fresh air from outside the equipment enclosure for delivery to the equipment chamber 16. The bidirectional opening thus functionally comprises a second outside air outlet 38A and a first outside air inlet 38B. It will be appreciated that in lieu of a single bidirectional air opening 38, the second outside air outlet 38A and the first outside air inlet 38B could be embodied as separate vent structures.

The lower set of louvered openings provide a second outside air inlet 40 of the temperature control unit 30. As described in more detail below, the outside air inlet 40 is arranged to receive fresh air from outside the equipment enclosure 2 for delivery to the air conditioning condenser (for heat exchange), or for alternative delivery to a lower portion of the equipment chamber 16 for cooling during an emergency mode of operation.

The front cover 32 of the temperature control unit 30 is sized so that its rear edge 42 engages the outside wall of the equipment enclosure's rear side panel 8, which may be provided with a weather seal to prevent moisture ingress into the enclosure. The air handler assembly 34 shown in FIG. 3 is designed to mount to the inside wall of the equipment enclosure's rear side panel 8. It may be provided with a rear flange 44 to facilitate such mounting. In FIG. 3, the gap between the rear edge 42 of the front cover 32 and the rear flange 44 of the air handler assembly 34 is sized according to the thickness of the rear side panel 8 of the equipment enclosure 2.

Figure 4:
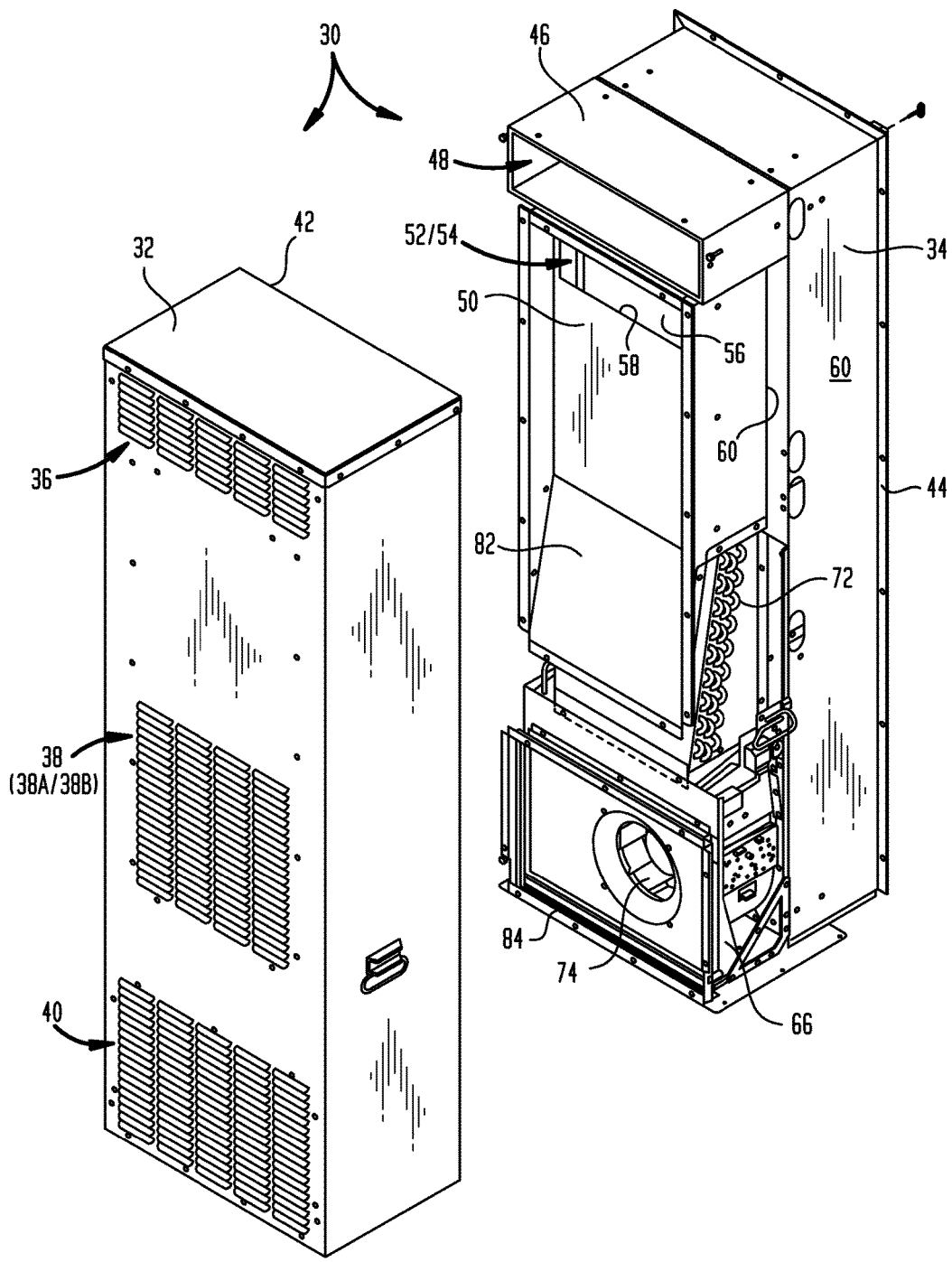
FIG. 4 is an exploded front perspective view showing the temperature control unit of FIG. 3, with a front cover thereof separated from a temperature control unit air handler assembly.
Figure 5:
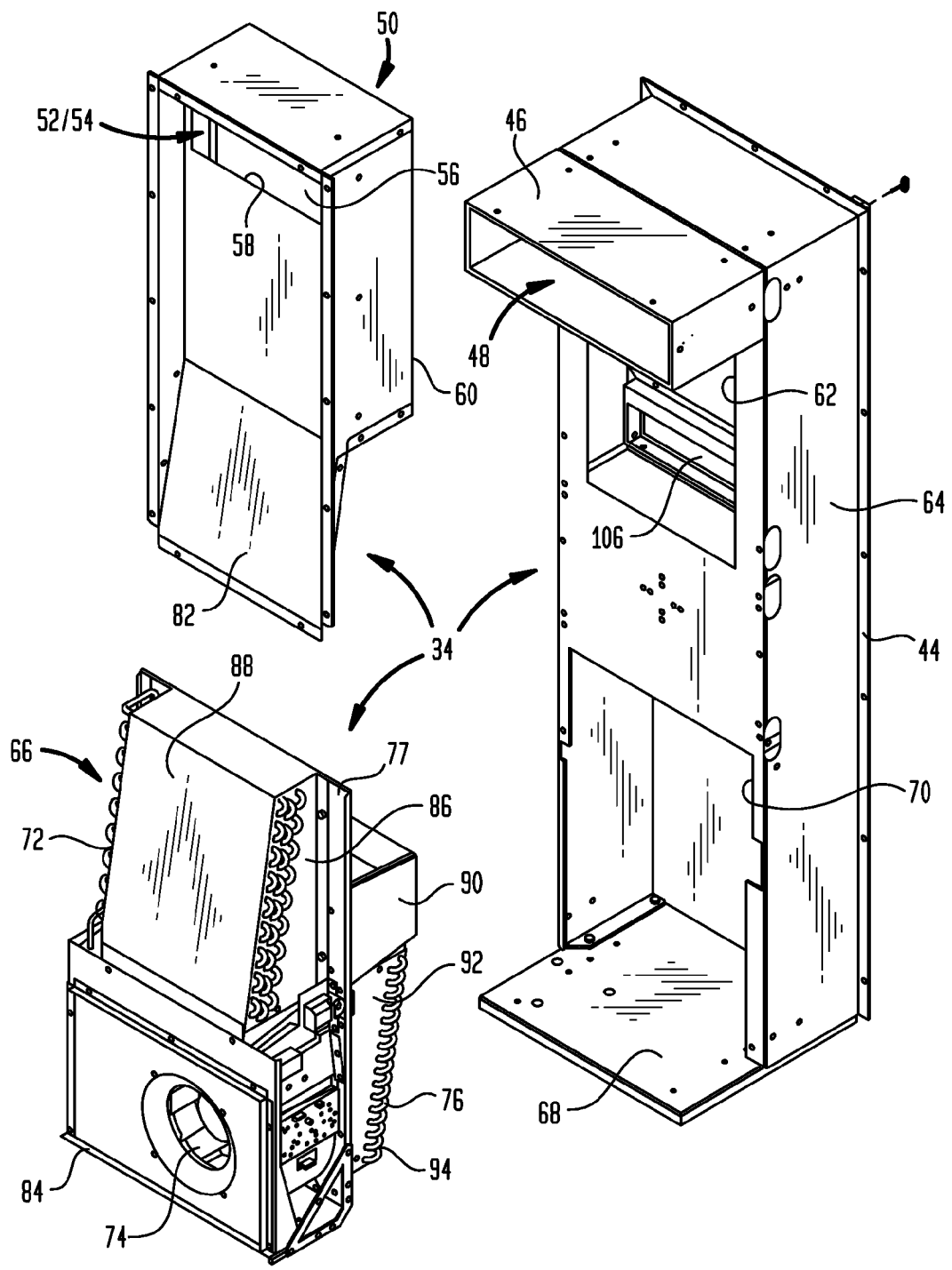
FIG. 5 is an exploded front perspective view showing the temperature control unit air handler assembly of FIG. 4, with an air conditioner unit and an air filter unit thereof being separated from an air handler base unit.

Turning now to FIG. 4, the front cover 32 of the temperature control unit 30 has been removed to reveal components of the air handler assembly 34. FIG. 5 shows an exploded view of the air handler assembly components.

One structure of interest shown in FIGS. 4 and 5 is an air plenum 46. As described in more detail below, the air plenum 46 provides part of an interior air exhaust pathway 48 whose outside end terminates at the outside air outlet 36 on the front cover 32.

Another structure of interest shown in FIGS. 4 and 5 is a bi-directional baffle unit 50. As described in more detail below, the baffle unit 50 provides part of a first fresh air inlet pathway 52, as well as part of an air conditioning warm air vent pathway 54. The outside ends of the pathways 52 and 54 terminate at the bidirectional air opening 38 on the front cover 32. An air filter 56 is seated in the baffle unit 50, and is spaced from an upper front wall 58 thereof. Fresh air that enters the fresh air inlet pathway 52 passes transversely through the air filter 56, where it is filtered to remove dust and debris. The filtered air passes out a back side 60 of the baffle unit 50 and into a first large opening 62 formed in a base unit 64 of the air handler assembly 34. The space between the air filter 56 and the upper front wall 58 of the baffle unit 50 forms part of the air conditioning warm air vent pathway 54. Warm air is received into the pathway 54 from a mechanical air conditioning unit 66, which is a further structure of interest shown in FIGS. 4 and 5.

The air conditioning unit 66 is situated below the baffle unit 50, and is supported on a lower support plate 68 of the air handler base unit 64, in front of a second large opening 70 at the bottom of the base unit 64. Advantageously, the air conditioning unit 66 is constructed as a modular assembly of the temperature control unit 30 that can be selectively attached to and detached from the air handler base unit 64. This facilitates expeditious maintenance and repair. Instead of having to send highly-skilled air conditioner repair personnel to make field repairs at a site where the equipment enclosure 2 is situated, a less skilled maintenance person can be dispatched to the site to detach the air conditioning unit 66 from the air handler assembly 34, and return it for repair at a shop. There, the air conditioning unit 66 can be repaired by air conditioning repair personnel employed by the owner of the equipment enclosure 2. Alternatively, if the owner does not employ any suitably trained air conditioner repair personnel, the air conditioning unit 66 can be sent out for repair by an air conditioner repair specialist, or to an air conditioner original equipment vendor. Thus, the owner of the equipment enclosure 2 need not retain such experts on its repair staff. Implementing the air conditioning unit 66 as a modular assembly also means that it can be offered as an optional component of the temperature control unit 30. If the equipment enclosure 2 will be deployed in very cold climates, the air conditioning unit 66 may not be necessary. In that case, a customer could purchase the air handler assembly 34 without any mechanical air conditioning, to be used strictly for free air cooling and heating. The large opening 70 in the air handler base unit 64 could then be covered with a panel or other suitable covering (not shown).

Figure 7:
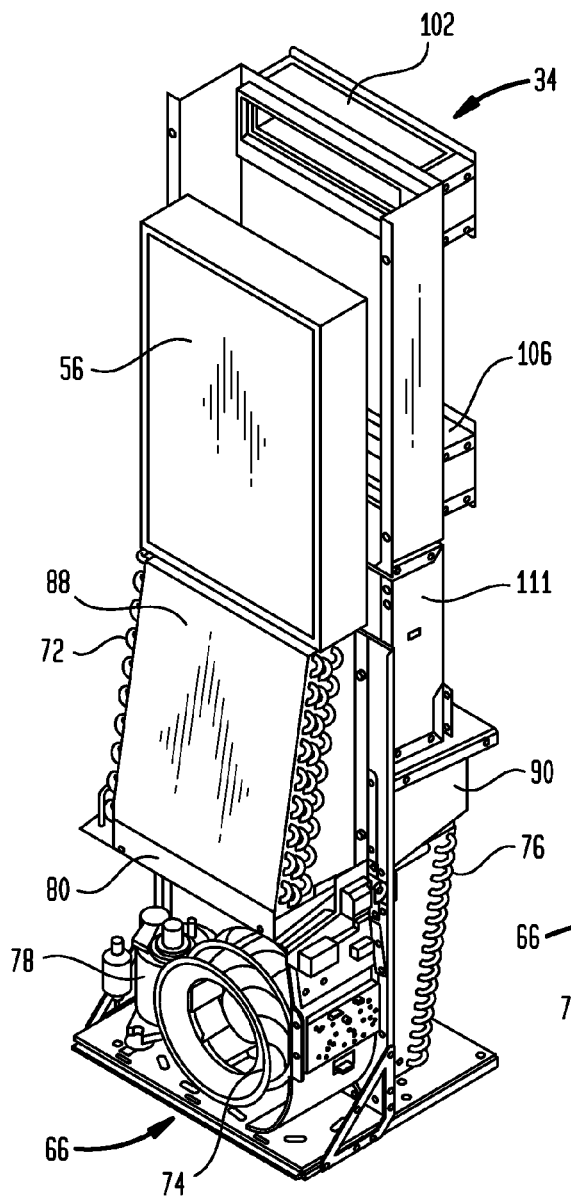
FIG. 7 is a diagrammatic front perspective view showing air handling and mechanical cooling components of the temperature control unit air handler assembly of FIG. 4.

As best shown in FIG. 5, the air conditioning unit 66 may include an air conditioning condenser coil unit (condenser) 72, an air conditioning (AC) air mover 74, and an air conditioning evaporator coil unit (evaporator) 76, all mounted on an air conditioner base frame structure 77 designed to be attached to the area of the air handler base unit 64 that surrounds the lower opening 70. Additional components of the air conditioning unit 66 that are not shown in FIG. 5, but which are illustrated in FIG. 7, include a variable speed air conditioning compressor 78 that is operably connected to pump a coolant (not shown) through a coolant loop that includes the condenser 72 and the evaporator 76. The air conditioning unit 66 may also includes a controllable, selectively positionable air flow damper 80. As described in more detail below, the damper 80 can be used to implement an emergency-free-air flow mode of operation, and thus may be referred to as the "emergency damper."

The condenser 72 and the AC air mover 74 are situated on the front side of the air conditioning unit 66, in front of the lower opening 70 in the air handler base unit 64. The condenser 72 sits adjacently below an angled lower front wall 82 of the baffle unit 50. The AC air mover 74 may be implemented as a radial blower fan. The inlet side of the AC air mover 74 lies within a short plenum 84 that is situated to receive fresh air from the outside air inlet 40 on the front cover 32. This is the inlet end of the air conditioning warm air vent pathway 54. The AC air mover 74 draws fresh air into this pathway and the emergency damper 80 is adjusted (vertically in FIG. 7) so that the outlet side of the AC air mover 74 directs the air to the angled lower side 86 of the condenser 72. The fresh air passes through the condenser 72, where it is warmed by drawing off heat from the coolant within the condenser coils. The warm air exits the angled upper side 88 of the condenser 72, and flows upwardly along the inside of the baffle unit's angled lower front wall 82, entering the space between the air filter 56 and the upper front wall 58 of the baffle unit 50. The warm air then passes over the front side of the baffle unit's upper front wall 58 and lower front wall 82, and vents through the outside bidirectional air opening 38 in the front cover 32. This is the outlet end of the air conditioning warm air vent pathway 54. As described in more detail below, the emergency damper 80 is operable to selectively communicate air from the outside air inlet 40 to the air conditioning warm air vent pathway 54 and to a second fresh air pathway 81 (see FIG. 10E) that passes through the evaporator 76 to an inside air outlet in order to deliver cool air to a lower portion of the equipment chamber 16. The second fresh air pathway 81 may be referred to as the emergency fresh air pathway.

As shown in FIG. 5, the evaporator 76 is situated on the rear side of the air conditioning unit 66, below an air plenum 90 that is also on the air conditioning unit's rear side. These components extend into the large lower opening 70 of the air handler assembly's base unit 64. As will be described in more detail in connection with FIG. 6, the air plenum 90 directs air downwardly to an angled front side 92 of the evaporator 76. The evaporator 76 pulls heat from this air, thereby cooling it, and the cooled air exits from the angled rear side 94 of the evaporator.

Figure 6:
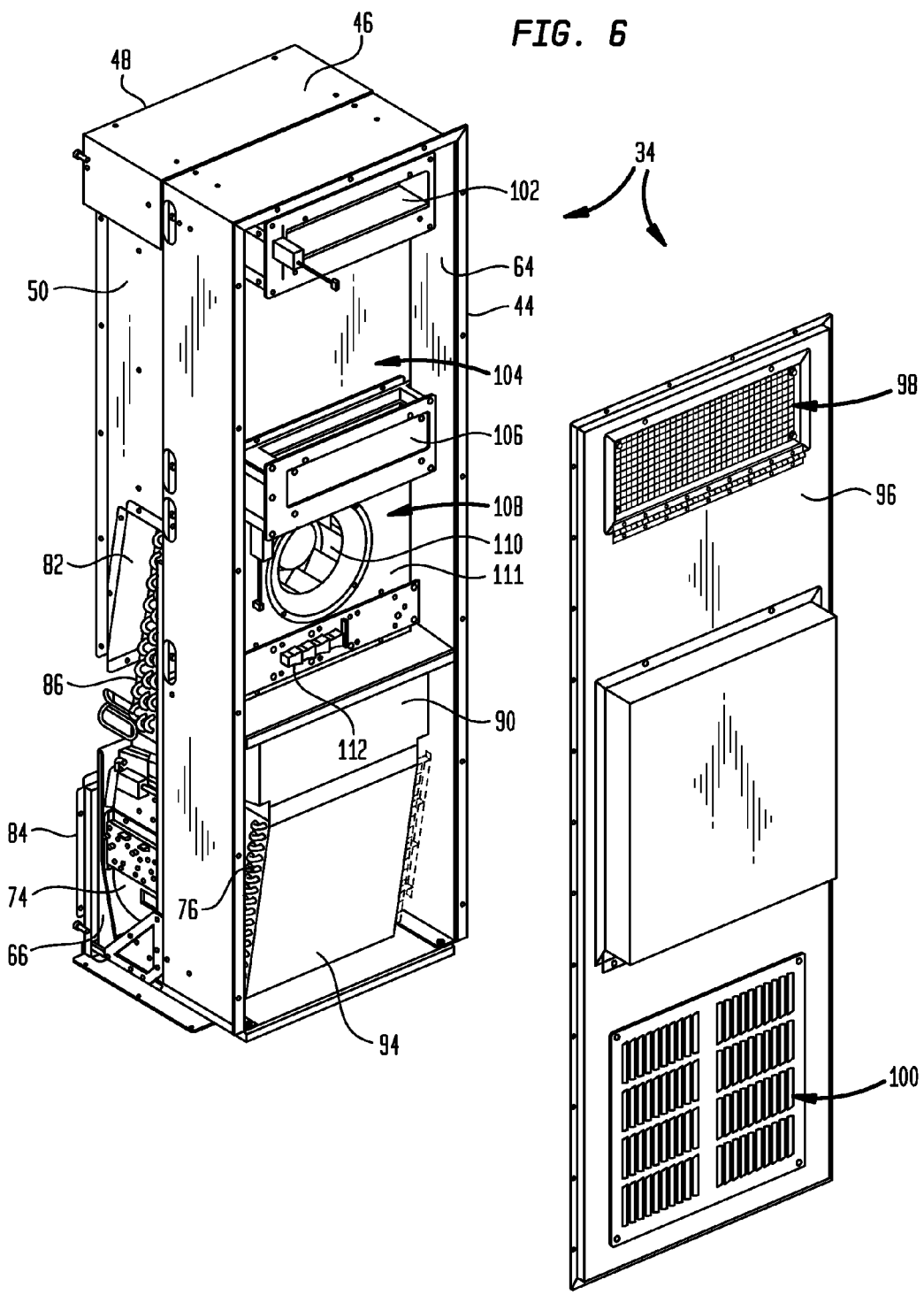
FIG. 6 is an exploded rear perspective view showing the air handler assembly of FIG. 5, with a rear cover thereof removed.

Turning now to FIG. 6, the rear side of the temperature control unit 30 is shown. In this view, the temperature control unit 30 is seen as having a louvered rear cover 96 that is removably mounted on the rear flange 44 of the air handler assembly 34. The rear cover 96 has two sets of louvered openings. The upper set of louvered openings provides an inside air inlet 98 of the temperature control unit 30. The lower set of louvered openings provides an inside air outlet 100 of the temperature control unit 30.

Figure 8:
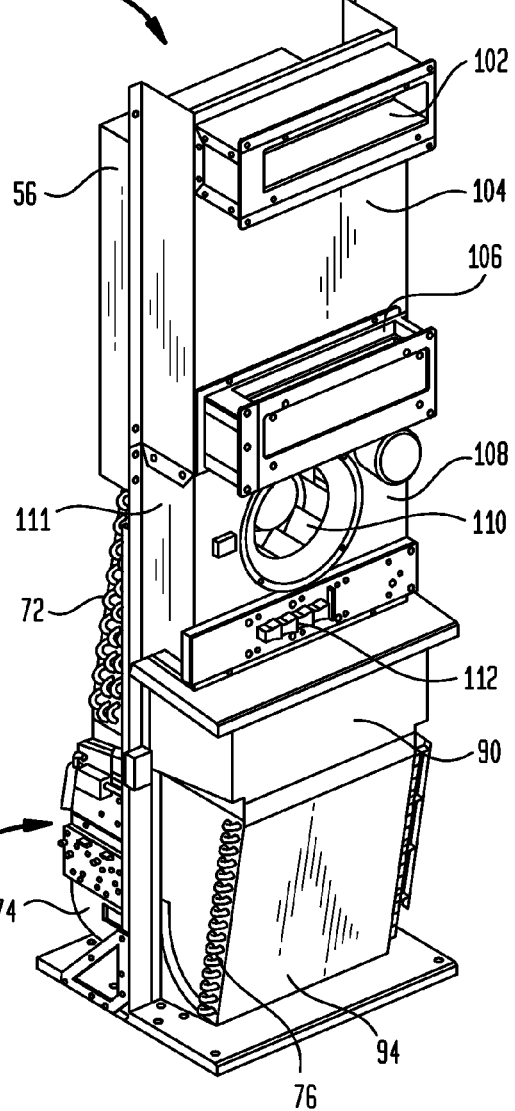
FIG. 8 is a diagrammatic rear perspective view showing the air handling and mechanical cooling components of the temperature control unit air handler assembly of FIG. 4.

The inside air inlet 98 is adapted to receive warm air from an upper portion of the equipment chamber 16. This air is warmed by heat given off from the equipment 70 within the equipment chamber 16. The warm air received at the inside air inlet 98 enters a controllable, selectively positionable upper air flow damper 102. The upper damper 102 is operable to selectively and variably communicate air from the inside air inlet 98 to the air exhaust pathway 48 and to an interior air return pathway 104 that begins at the inside air inlet 98 and ends at the inside air outlet 100. The interior air return pathway 104 further includes a controllable, selectively positionable lower air flow damper 106. As can be seen in FIGS. 7 and 8, the lower damper 106 is operable to selectively and variably communicate air from the interior air return pathway 104 and the fresh air inlet pathway 52 to the inside air outlet 100. As shown in FIG. 7 (and also in FIG. 5), the fresh air inlet pathway 52 passes through the front side of the lower damper 106 from the rear side of the air filter 56. As shown in FIGS. 6 and 8, the interior air return pathway 104 passes through the top side of the lower damper 106. Air from both pathways exits the bottom side of the lower damper 106 into a merged common air pathway 108. The common air pathway 108 thus serves as a lower portion of both the fresh air inlet pathway 52 and the interior air return pathway 104.

As further shown in FIGS. 6 and 8, the air handler assembly 34 further includes a primary air mover 110 disposed to move air through the fresh air inlet pathway 52 and the interior air return pathway 104. The primary air mover 110 may be implemented as a radial blower fan. It may be conveniently mounted in a plenum 111 forming part of the air handler assembly's base unit 64. The inlet of the primary air mover 110 is situated below and in front of the bottom side of the lower damper 106. The outlet of the primary air mover 110 delivers air downwardly through the plenum 111 of the air handler base unit 64 into the plenum 90 of the air conditioner unit 66. As also shown in FIGS. 6 and 8, an air heater 112, which can be removably mounted in the plenum 111 as a modular component, is situated between the outlet of the primary air mover 110 and the entrance to the plenum 90 of the air conditioning unit 66. It will be appreciated that the portions of the interior air return pathway 104 and the common air pathway 108 that are uncovered in FIGS. 6 and 8, will be enclosed by the rear cover 96 when it is mounted on the air handler assembly 34.

Turning now to FIG. 9, a diagrammatic side view representation of the temperature control unit 30 is shown as a prelude to discussing various modes of operation that may be implemented by the control unit. The left hand side of FIG. 9 represents the ambient environment outside the temperature control unit 30, while the right hand side represents the enclosure side of the control unit. The temperature control components depicted in FIG. 9 include the air filter 56, the air conditioning condenser 72, the AC air mover 74, the air conditioning evaporator 76, the variable speed air conditioning compressor 78, the emergency damper 80, the upper damper 102, the lower damper 106, the plenum 111, and the heater 112.

FIGS. 10A-10E are based on FIG. 9, and illustrate example operational modes of the temperature control unit 30. The orientation is as shown in FIG. 9, with the left hand side of each figure representing the ambient environment outside the temperature control unit 30, and the right hand side representing the enclosure side of the control unit.

Figure 10A:
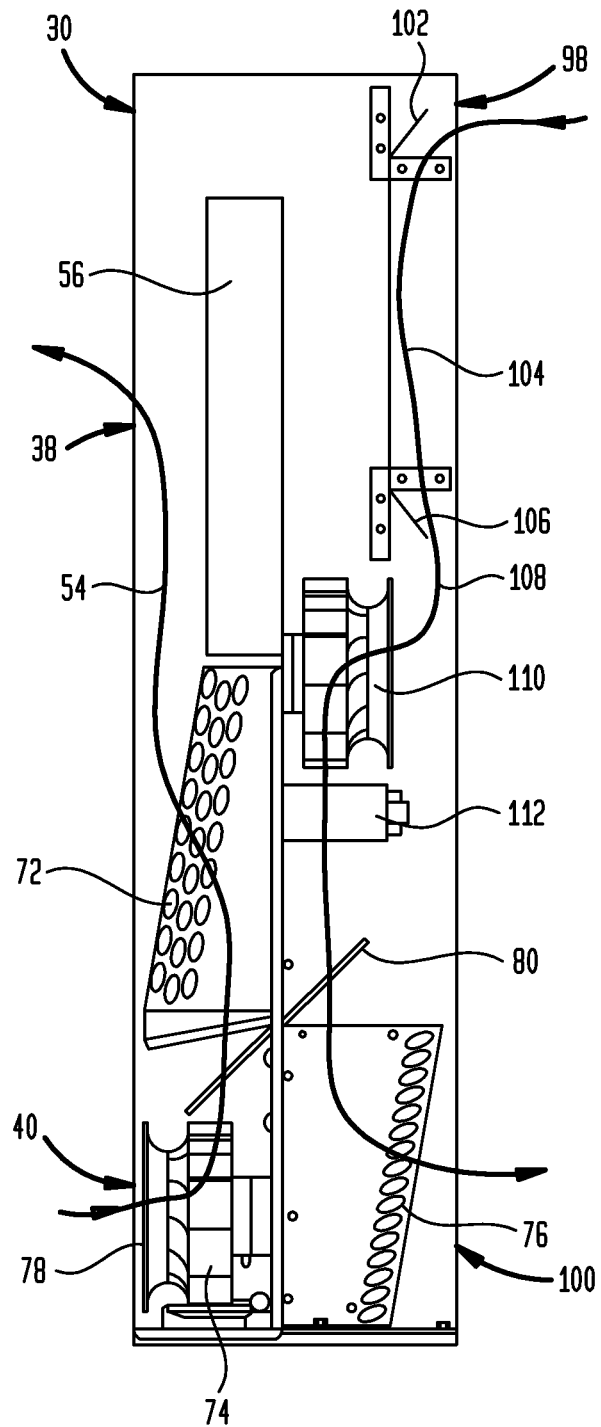
FIG. 10A is a diagrammatic side view of the air handling and mechanical cooling components of FIGS. 7 and 8, showing air flow during an air-conditioning mode of operation.

In FIG. 10A, an air-conditioning mode of operation is shown. In this mode, the interior air return pathway 104 (including the portion thereof provided by the common air pathway 108) and the air conditioning warm air vent pathway 54 are utilized. The interior air return pathway 104 (including the portion thereof provided by the common air pathway 108) circulates air through the equipment chamber 16 in an internal loop, receiving warm air from the upper portion of the equipment chamber and returning cool conditioned air to the lower portion of the chamber. The air conditioning warm air vent pathway 54 circulates air through the air conditioning condenser 72 in an external loop, receiving cool outside air, passing it through the condenser to remove heat from the coolant therein, and expelling the warm air containing heat given off by the condenser back to the outside environment.

To implement the air-conditioning mode shown in FIG. 10A, the components of the temperature control unit 30 are placed in the following state:
 (1) the AC air mover 74 is in a power-on state;
 (2) the primary air mover 110 is in a power-on state;
 (3) the variable speed air conditioning compressor 78 is in a power-on state and operating at a selected speed;
 (4) the air heater 112 is in a power-off state;
 (5) the upper damper 102 is positioned to communicate air from the inside air inlet 98 to the interior air return pathway 104, while blocking air flow to the interior air exhaust pathway 48 (i.e., the upper damper 102 is vertical in FIG. 10A);
 (6) the lower damper 106 is positioned to communicate air from the interior air return pathway 104 to the inside air outlet 100, while blocking air flow from the outside bidirectional air opening 38 (i.e., the lower damper 106 is vertical in FIG. 10A); and
 (7) the emergency damper 80 is positioned to block air flow through the emergency fresh air pathway 81 (see FIG. 10E), while allowing air communication from the outside air inlet 40 through the air conditioning warm air vent pathway 54 to the outside bidirectional air opening 38 (i.e., the emergency damper 80 is vertical in FIG. 10A).

Figure 10B:
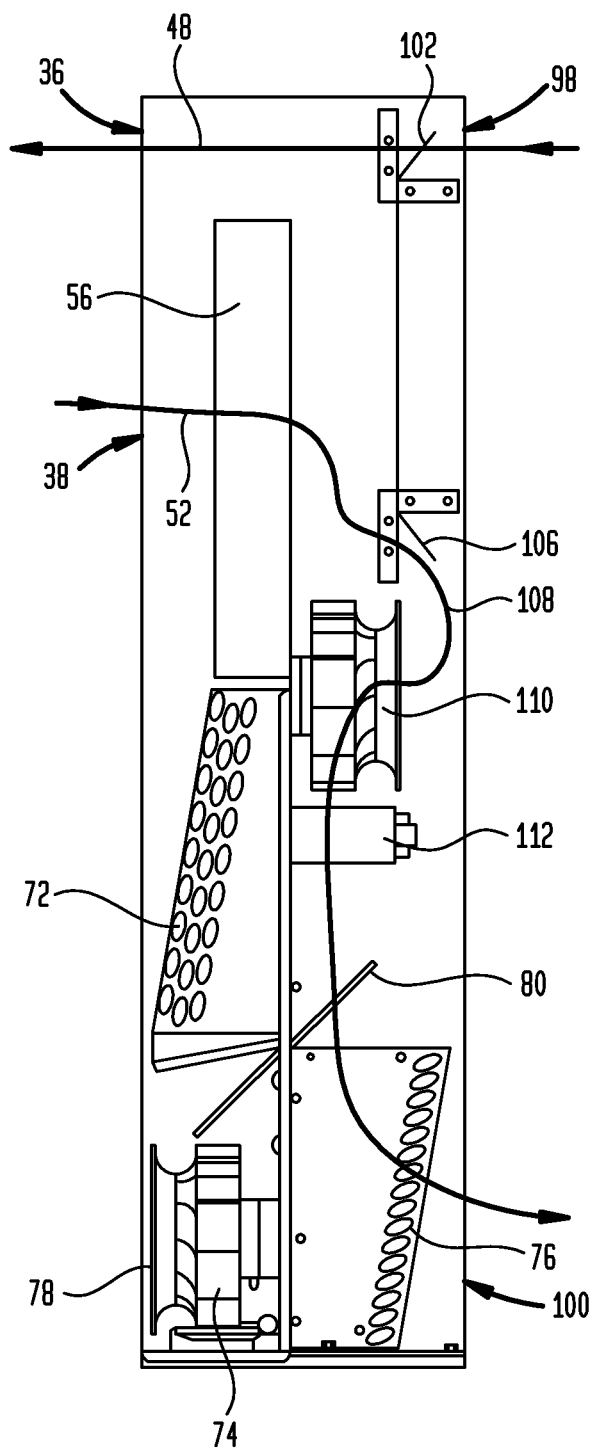
FIG. 10B is a diagrammatic side view of the air handling and mechanical cooling components of FIGS. 7 and 8, showing air flow during a free-air-cooling mode of operation.

In FIG. 10B, a free-air-cooling mode of operation is shown. In this mode, the interior air exhaust pathway 48 and the fresh air inlet pathway 52 (including the portion thereof provided by the common air pathway 108) are utilized. The interior air exhaust pathway 48 receives warm air from the upper portion of the equipment chamber 16 and vents it out of the equipment enclosure 2 to the outside environment. The fresh air inlet pathway 52 receives cool outside air and delivers to the lower portion of the equipment chamber 16.

To implement the free-air-cooling mode shown in FIG. 10B, the components of the temperature control unit 30 are placed in the following state:
 (1) the AC air mover 74 is in a power-off state;
 (2) the primary air mover 110 is in a power-on state;
 (3) the variable speed air conditioning compressor 78 is in a power-off state;
 (4) the air heater 112 is in a power-off state;
 (5) the upper damper 102 is positioned to communicate air from the inside air inlet 98 through the interior air exhaust pathway 48 to the outside air outlet 36, while blocking air flow from the inside air inlet to the interior air return pathway 104 (i.e., the upper damper 102 is horizontal in FIG. 10B);
 (6) the lower damper 106 is positioned to communicate air from the outside bidirectional air opening 38 through the fresh air inlet pathway 52 to the inside air outlet 100, while blocking air flow from the inside air inlet 98 (i.e., the lower damper 106 is horizontal in FIG. 10B); and
 (7) the emergency damper 80 is positioned to block air flow through the emergency fresh air pathway 81 (see FIG. 10E) (i.e., the emergency damper 80 is vertical in FIG. 10B).

In FIG. 10C, a free-air-cooling-with-return mode of operation is shown. In this mode, the interior air exhaust pathway 48, the fresh air inlet pathway 52, and the interior air return pathway (including the portions of pathways 52 and 104 provided by the common air pathway 108) are utilized. The interior air exhaust pathway 48 receives warm air from the upper portion of the equipment chamber 16 and vents it out of the equipment enclosure 2 to the outside environment. At the same time, the upper portion of interior air return pathway 104 directs some of the warm air to the common air pathway 108, where it mixes with fresh air from the upper portion of the fresh air inlet pathway 52, and is then delivered to the lower portion of the equipment chamber 16.

To implement the free-air-cooling-with-return mode shown in FIG. 10C, the components of the temperature control unit 30 are placed in the following state:

(1) the AC air mover 74 is in a power-off state;
(2) the primary air mover 110 is in a power-on state;
(3) the variable speed air conditioning compressor 78 is in a power-off state;
(4) the air heater 112 is in a power-off state;
(5) the upper damper 102 is positioned to communicate air from the inside air inlet 98 to the interior air exhaust pathway 48 to the outside air outlet 36, while also allowing air flow from the inside air inlet to the interior air return pathway 104 (i.e., the upper damper 102 is angled between vertical and horizontal in FIG. 10C);
(6) the lower damper 106 is positioned to communicate air from the outside bidirectional air opening 38 through the fresh air inlet pathway 52 to the inside air outlet 100, while also allowing air flow from the inside air inlet 98 through the interior air return pathway 104 to the inside air outlet 100 (i.e., the lower damper 106 is angled between vertical and horizontal in FIG. 10C); and
(7) the emergency damper 80 is positioned to block air flow through the emergency fresh air pathway 81 (see FIG. 10E) (i.e., the emergency damper 80 is vertical in FIG. 10C).

In FIG. 10D, a heating mode of operation is shown. In this mode, the interior air return pathway 104 (including the portion thereof provided by the common air pathway 108) is utilized. The interior air return pathway 104 receives warm air from the upper portion of the equipment chamber 16, passes the warm air through the air heater 112 for heating, then delivers the heated air to the lower portion of the equipment chamber 16.

To implement the heating mode shown in FIG. 10D, the components of the temperature control unit 30 are placed in the following state:

(1) the AC air mover 74 is in a power-off state;
(2) the primary air mover 110 is in a power-on state;
(3) the variable speed air conditioning compressor 78 is in a power-off state;
(4) the air heater 112 is in a power-on state;
(5) the upper damper 102 is positioned to communicate air from the inside air inlet 98 to the interior air return pathway 104, while blocking air flow from the inside air inlet to the interior air exhaust pathway 48 (i.e., the upper damper 102 is vertical in FIG. 10D);
(6) the lower damper 106 is positioned to communicate air from the interior air return pathway 104 to the inside air outlet 100, while blocking air flow from the outside bidirectional air opening 38 (i.e., the lower damper 106 is vertical in FIG. 10D); and
(7) the emergency damper 80 is positioned to block air flow through the emergency fresh air pathway 81 (see FIG. 10E) (i.e., the emergency damper 80 is vertical in FIG. 10D).

Figure 10E:
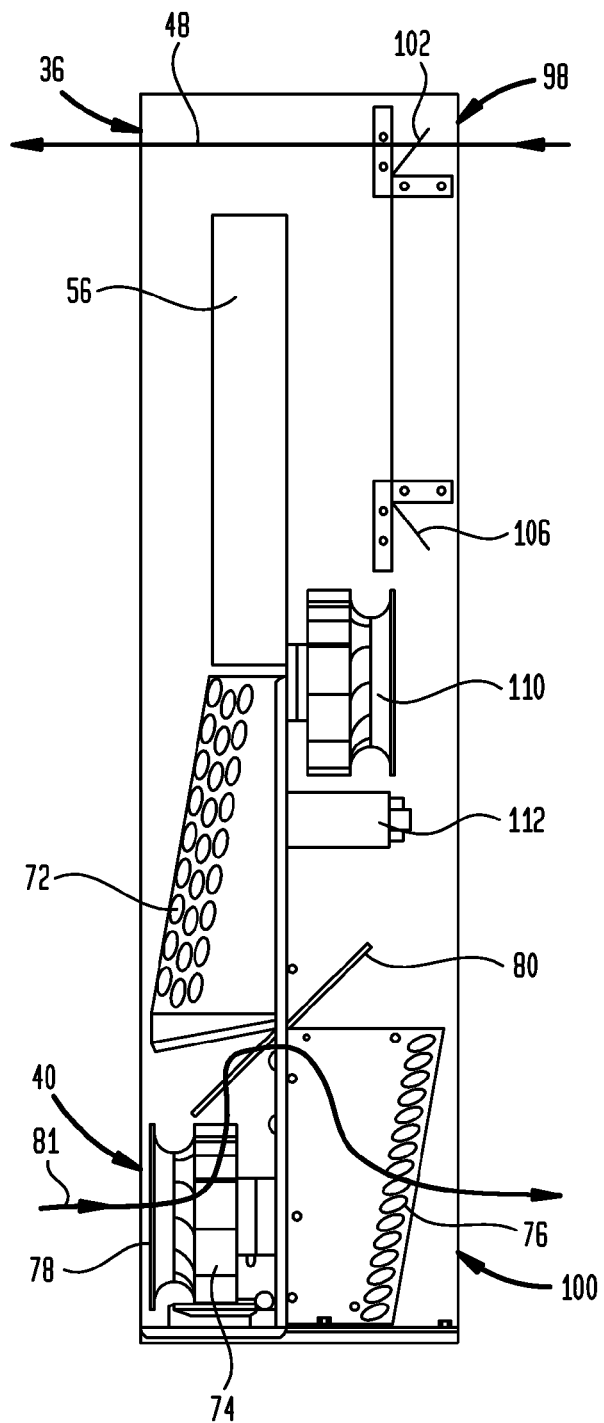
FIG. 10E is a diagrammatic side view of the air handling and mechanical cooling components of FIGS. 7 and 8, showing air flow during an emergency-free-air cooling mode of operation.

In FIG. 10E, an emergency-free-air-cooling mode of operation is shown. In this mode, the emergency fresh air pathway 81 is utilized. This pathway receives fresh air from outside air inlet 40 and delivers it the lower portion of the equipment chamber 16 using the AC air mover 74 of the air conditioning unit 66 as a backup air mover due to the primary air mover 110 being inoperable.

To implement the emergency free-air-cooling mode shown in FIG. 10E, the components of the temperature control unit 30 are placed in the following state:

(1) the AC air mover 74 is in a power-on state;
(2) the primary air mover 110 is in a power-off state;
(3) the variable speed air conditioning compressor 78 is in a power-off state;
(4) the air heater 112 is in a power-off state;
(5) the upper damper 102 is positioned to communicate air from the inside air inlet 98 through the interior air exhaust pathway 48 to the outside air outlet 36, while blocking air flow from the inside air inlet to the interior air return pathway 104 (i.e., the upper damper 102 is horizontal in FIG. 10E);
(6) the lower damper 106 is positioned to block air flow from the outside bidirectional air opening 38 (i.e., the lower damper 106 is vertical in FIG. 10E); and
(7) the emergency damper 80 is positioned to allow air flow through the emergency fresh air pathway 81 (i.e., the emergency damper 80 is horizontal in FIG. 10E). In this position, the emergency damper 80 blocks air flow through the air conditioning warm air vent pathway 54 and directs it rearwardly through the evaporator and into the equipment chamber. As shown in FIG. 10E, the emergency damper 80 may be implemented as a butterfly valve, with an additional upper portion disposed in the air plenum 90 (see FIGS. 5 and 6) to block air flowing downwardly through the common air flow pathway 108.

Turning now to FIG. 11, the operations of the temperature diverter system 50 are managed by a temperature controller (TC) 120 that may be embodied in any suitable manner, including as a programmed microprocessor or central processing unit (CPU), a field programmable gate array (FPGA), an application specific integrated circuit (ASIC), etc. The temperature controller 120, which can be mounted at any suitable location on the temperature control unit 30, performs temperature control operations that control AC air mover 74, the AC compressor 78, the emergency damper 80, the upper damper 102, the lower damper 106 and the primary air mover, all of which are connected to the temperature controller 120 in a suitable manner. The operations of the temperature controller 120 are based on inputs received from a lower temperature sensor 122, an upper temperature sensor 124, and an outside temperature sensor 126. All three temperature sensors may be mounted on the temperature control unit 30 itself. The lower temperature sensor 122 is situated at a lower location on the temperature control unit 30 (e.g. near the inside air outlet 100) in order to obtain temperature readings (Tb) at or near the bottom of the equipment chamber 16. The upper temperature sensor 124 is situated at an upper location on the temperature control unit 30 (e.g. near the inside air inlet 98) in order to obtain temperature readings (Tt) at or near the top of the equipment chamber 16. The outside temperature sensor 126 is situated at a location on the temperature control unit 30 that allows it to obtain temperature readings (To) outside the equipment chamber 16 (e.g., near the outside air inlet 40). The temperature controller 120 also receives programmable inputs, either statically as part of the controller's program logic, or dynamically via a user interface 128. These programmable inputs include a low temperature set point value (SPl) 130, a high temperature set point value (SPh) 132, and a temperature dead band value (DB) 134. The SPl and SPh values 130 and 132 respectively represent the acceptable minimum and maximum temperatures within the equipment chamber 16, and thus define a desired temperature range. By way of the example, the low temperature set point SPl could be set to 10 degrees Celsius and the high temperature set point SPh could be set to 25 degrees Celsius. The DB value 134 represents a hysteresis value to prevent rapid cycling between operational modes. By way of example, its value could be 2-3 degrees Celsius.

Turning now to FIGS. 12A-12C, an example control routine that may be implemented by the temperature controller 120 is shown. It should be understood that the illustrated control routine is exemplary only, and that other control routines could be implemented by the temperature controller 120 according to operational requirements or preferences. The overall goal of the illustrated control routine is to adjust the configuration of the temperature control unit 30 to implement the various modes of operation in response to changing temperature conditions both inside and outside the equipment enclosure 2. In an example embodiment, the temperature controller 120 may be configured to implement the control routine on a periodic basis, such every few seconds, every few minutes, etc., with the goal of finding an operational mode that is best suited for the equipment enclosure 2 in terms of effectiveness and economy of operation. The control routine itself generally comprises cycling through the decision boxes on the left side of FIGS. 12A-12C, changing operational modes as necessary according to the temperature sensor inputs received.

At the outset of the control routine, temperature readings from the temperature sensors 122, 124 and 126 are sampled and stored, and compared against the stored parameters 130 (SPl), 132 SPh) and 134 (DB). Some of the processing operations performed by the temperature controller 120 utilize an average temperature (T) within the equipment enclosure. The average temperature T is determined by averaging the lower and upper temperature values Tb and Tt obtained from the lower and upper temperature sensors 122 and 124, respectively.

Turning now to FIG. 12A, blocks 140-146 illustrate example processing performed during the emergency-free-air-cooling mode of operation. This processing is performed when the average temperature T within the equipment chamber 16 reaches an extremely high value and other operational modes (including air conditioning) have not been effective. In some cases, the primary air mover 110 will also be non-operational. In block 140, the temperature controller 120 checks whether the average temperature T is greater than the high temperature set point SPh plus the dead band value DB. If the condition in block 140 is not found, the processing proceeds to check for alternative operational modes, beginning in block 148 (see below). If the condition in block 140 is detected, the program logic assumes that the current mode of operation (including the air conditioning mode) is not effectively controlling the temperature inside the equipment chamber 16. Therefore in block 142, the temperature control unit 30 is placed in the emergency-free-air-cooling mode (see FIG. 10E) and the AC air mover 74 is operated at a speed that provides maximum free air cooling. It should be noted that block 142 may be reached independently of block 140 being implemented by the temperature controller 120. In particular, the temperature control unit 30 could be provided with separate hardware logic (not shown) whose purpose is to activate the emergency-free-air-cooling mode whenever the primary air mover 110 fails. This would provide an additional measure of fail safety to prevent expensive equipment damage within the equipment chamber 16 in the event of failure of the primary air mover 110. After implementing the emergency-free-air-cooling mode in block 142, the temperature controller 120 checks in block 144 whether the average temperature T has fallen below the high temperature set point SPh. If it has, processing proceeds to block 148 to resume checking for alternative operational modes. If the average temperature T is still above SPh in block 144, block 146 checks whether the outside temperature To is less than SPh. If it is, processing again proceeds to block 148 to begin the check for another operational mode (such as free-air-cooling). If block 146 determines that To is not less than SPh, processing returns to block 142 and the AC air mover 74 continues to provide maximum free air cooling.

Continuing with FIG. 12A, blocks 148-160 illustrate example processing performed during the air-conditioning mode of operation. In block 148, the temperature controller checks whether the outside temperature To is greater that the low temperature set point SPl and the average temperature T is extremely high, e.g., greater than the high temperature set point SPh plus the dead band value DB. If the condition in block 148 is not found, processing proceeds to block 162 in FIG. 12B to resume the search for an appropriate operational mode. If the condition in block 148 is detected, the temperature control unit 30 is placed in the air-conditioning mode (see FIG. 10A) and block 150 performs proportional integral (PI) control of the variable speed compressor 78 of the air conditioning unit 66 in order to reduce the average temperature T to the high temperature set point SPh, or below. The speed of the AC air mover 74 will be proportional to the compressor speed. In block 152, the temperature controller 120 adjusts the speed of the primary air mover 110 based on the difference of temperature from the top to the bottom of the equipment chamber 16. In block 154, the temperature controller 120 checks whether the average temperature T is now less than the high temperature set point SPh. If it is, processing proceeds to block 162 in FIG. 12B to check the next operational mode. Otherwise block 156 checks whether the average temperature T is still greater than the high temperature set point SPh plus the dead band value DB. If so, processing again proceeds to block 162 to resume mode checking (it being likely that the emergency-free-air-cooling mode will be needed). Otherwise, block 158 checks whether the compressor 78 running below its normal speed capability. If it is, processing again proceeds to block 162 to resume mode checking (it again being likely that the emergency-free-air-cooling mode will be needed). Otherwise, block 160 checks whether the outside temperature To is less than the high temperature set point SPh. If it is, processing returns to block 150 to continue the air-conditioning mode (it being likely that emergency-free-air-cooling mode is not needed). Otherwise, if the condition in block 150 is not found, processing proceeds to block 162 to consider the next mode.

Turning now to FIG. 12B, blocks 162-168 illustrate example processing performed during the free-air-cooling mode of operation. In block 162, the temperature controller checks whether the average temperature T is less than the high temperature set point SPh and greater than the low temperature set point SPl plus the dead band value DB. If the condition in block 162 is not found, processing proceeds to block 170 in FIG. 12B to resume the search for an appropriate operational mode. If the condition in block 162 is detected, the temperature control unit 30 is placed in the free-air-cooling mode (see FIG. 10B) and block 164 adjusts the speed of the primary air mover 110 based on the difference of temperature from the top to the bottom of the equipment chamber 16 in block 164. In block 166, the temperature controller 120 checks whether the average temperature T is still less than the high temperature set point SPh. If it is, processing proceeds to block 170 in FIG. 12B to check the next mode of operation. Otherwise, if the condition in block 166 is not detected, block 168 checks whether the bottom temperature Tb is less than the low set point temperature SPl. If it is, processing proceeds to block 170 to check the next mode of operation. Otherwise, processing returns to block 164 to continue the free-air-cooling mode.

Blocks 170-184 illustrate example processing performed during the free-air-cooling-with-return mode of operation. In block 170, the temperature controller 120 checks whether the average temperature T is greater than the low temperature set point SPl plus the dead band value DB, and is less than the high temperature set point SPl. If the condition in block 170 is not found, processing proceeds to block 186 in FIG. 12C to resume the search for an appropriate operational mode. If the condition in block 170 is detected, the temperature control unit 30 is placed in the free-air-cooling-with-return mode (see FIG. 10C) and block 172 adjusts the speed of the primary air mover 110 based on the difference of temperature from the top to the bottom of the equipment chamber 16 in block 164. In block 174, the temperature controller 120 checks whether the outside temperature To is less than 0 degrees (Celsius). If it is, block 176 checks whether the temperature Tt at the top of the equipment chamber 16 is greater than the high temperature set point SPh plus the dead band value DB, indicating an extremely high temperature. If it is, block 178 adjusts the upper and lower dampers 102 and 106 to provide free cooling mixed with return air flow. Otherwise, block 180 adjusts the upper and lower dampers 102 and 106 to provide circulating air flow (i.e., similar to the heating mode but without activating the air heater 112). If in block 174 it was determined that the outside temperature To is not less than 0 degrees (Celsius), block 182 checks whether the average temperature T is greater than the high temperature set point SPh. If it is, processing proceeds to block 186 in FIG. 12C to consider the next operational mode. Otherwise, block 184 checks whether the average temperature T is less than the low temperature set point SPl. If it is, processing again proceeds to block 186 to check for another operational mode. Otherwise, processing returns to block 172 to continue the free-air-cooling-with-return mode.

Turning now to FIG. 12C, blocks 186-190 illustrate example processing performed during the heating mode of operation. In block 186, the temperature controller 120 checks whether the outside temperature To is less than the low temperature set point SPl and the average temperature T is greater than the low temperature set point SPl minus the dead band value DB. If the condition in block 186 is not found, processing returns to block 140 in FIG. 12A to restart the search for an appropriate operational mode. If the condition in block 186 is detected, the temperature control unit 30 is placed in the heating mode (see FIG. 10D) and block 188 activates the air heater 112. Processing proceeds to block 190, in which the temperature controller 120 checks whether the temperature Tt at the top of the equipment chamber 16 is greater than the low temperature set point SPl. If it is, another operational mode is probably more appropriate, and processing returns to block 140 in FIG. 12A to restart the search for such a mode. Otherwise, processing returns to block 188 in order to continue the heating mode.

Figure 14:
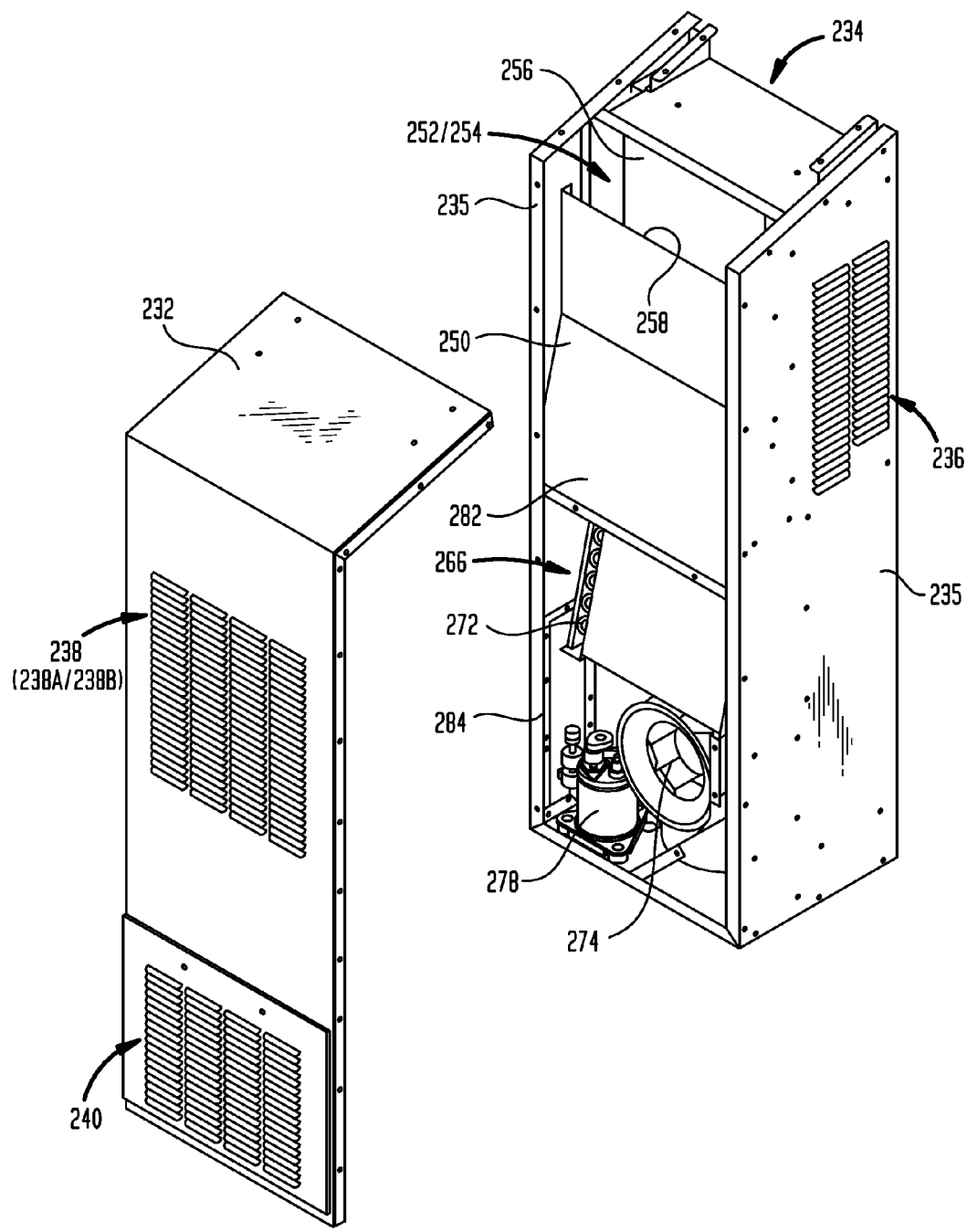
FIG. 14 is an exploded front perspective view showing the temperature control unit of FIG. 13, with a front cover thereof separated from a temperature control unit air handler assembly.

Turning now to FIGS. 13 and 14, an alternative temperature control unit 230 may be used in lieu of the temperature control unit 30 to provide a self-contained modular portion of the equipment enclosure 2 that can be attached and detached as necessary. The temperature control unit 230 is shown as having a louvered front cover 232 that is removably mounted on the frame of an air handler assembly 234. A pair of side covers 235, of mirror image construction, are also removably mounted to the air handler assembly 234. The front cover 232 has two sets of louvered openings, and each side cover 235 has one set of louvered openings. The louvered openings on the side covers 235 provide a first outside air outlet 236 of the temperature control unit 230. As described in more detail below, the outside air outlet 236 is arranged to vent warm air received from the upper portion of the equipment chamber 16 to the ambient environment outside the equipment enclosure 2.

The upper set of louvered openings on the front cover 232 provides an outside bidirectional air opening 238 of the temperature control unit 230. As described in more detail below, the outside bidirectional air opening 238 is arranged to receive warm air from an air conditioning condenser and vent it outside the equipment enclosure 2, as well as to receive fresh air from outside the equipment enclosure for delivery to the equipment chamber 16. The bidirectional air opening thus functionally comprises a second outside air outlet 238A and a first outside air inlet 238B. It will be appreciated that in lieu of a single bidirectional air opening 238, the second outside air outlet 238A and the first outside air inlet 238B could be embodied as separate vent structures.

The lower set of louvered openings on the front cover 232 provide a second outside air inlet 240 of the temperature control unit 230. As described in more detail below, the outside air inlet 240 is arranged to receive fresh air from outside the equipment enclosure 2 for delivery to the air conditioning condenser (for heat exchange).

Figure 15:
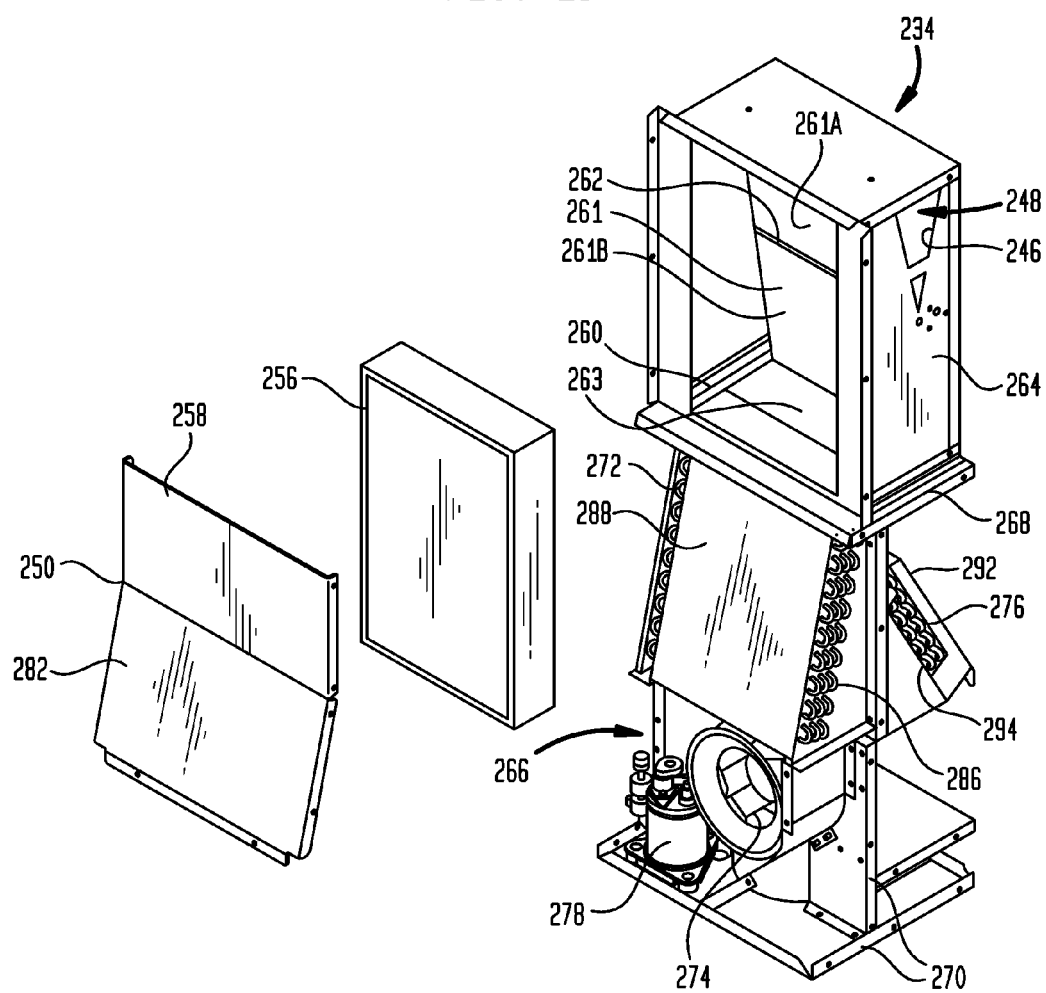
FIG. 15 is an exploded front perspective view showing the temperature control unit air handler assembly of FIG. 14, with a side cover removed and a baffle unit and an air filter unit thereof being separated from an air handler base unit.

In FIG. 14, the front cover 232 of the temperature control unit 230 has been removed to reveal interior components of the air handler assembly 234. FIG. 15 shows the air handler assembly 234 with the side covers 236 additionally removed, and with baffle and air filter components thereof separated from the remainder of the air handler assembly.

One structure of interest shown in FIGS. 14 and 15 is the air vent 246 on the exposed side wall of the air handler assembly 234. Although not shown in FIG. 15 (but depicted in FIG. 18C) an identical side air vent 246 is on the opposite side wall of the air handler assembly 234. As described in more detail below, the side air vents 246 provide part of an interior air exhaust pathway 248 whose outside end terminates at the outside air outlets 236 on the side covers 235.

Another structure of interest shown in FIGS. 14 and 15 is a bi-directional baffle unit 250. As described in more detail below, the baffle unit 250 provides part of a fresh air inlet pathway 252, as well as part of an air conditioning warm air vent pathway 254. The outside ends of the pathways 252 and 254 terminate at the bidirectional air opening 238 on the front cover 232. An air filter 256 is seated behind the baffle unit 250 in the air handler assembly 234. It is rearwardly spaced from an upper front wall 258 of the baffle unit 250. Fresh air that enters the fresh air inlet pathway 252 from the outside bidirectional air opening 238 passes transversely through the air filter 256, where it is filtered to remove dust and debris. The filtered air enters the interior 260 of the air handler assembly 234.

Depending on the position of a butterfly damper 261 (shown in FIG. 15), the air from the first air inlet pathway 252 passes through a large air transfer opening 263 formed in a base unit 264 of the air assembly 134. The butterfly damper 261 comprises a large damper paddle that is mounted at its approximate mid-section to a rotary-actuated pivot rod 262 whose ends are rotatably secured at the sides of the air handler base unit 264. The damper paddle has upper and lower portions 261A and 261B that respectively lie above and below the pivot rod 262. The upper and lower damper paddle portions 261A and 261B can be angled forwardly and rearwardly in opposition to each other by actuating the pivot rod 262. As will now be explained, this movement of the upper and lower damper portions 261A and 261B effects simultaneous changes to separate air flow pathways of the temperature control unit 230. As such, the upper and lower damper portions 261A and 261B will hereinafter be referred to as separate upper and lower dampers.

Figure 16:
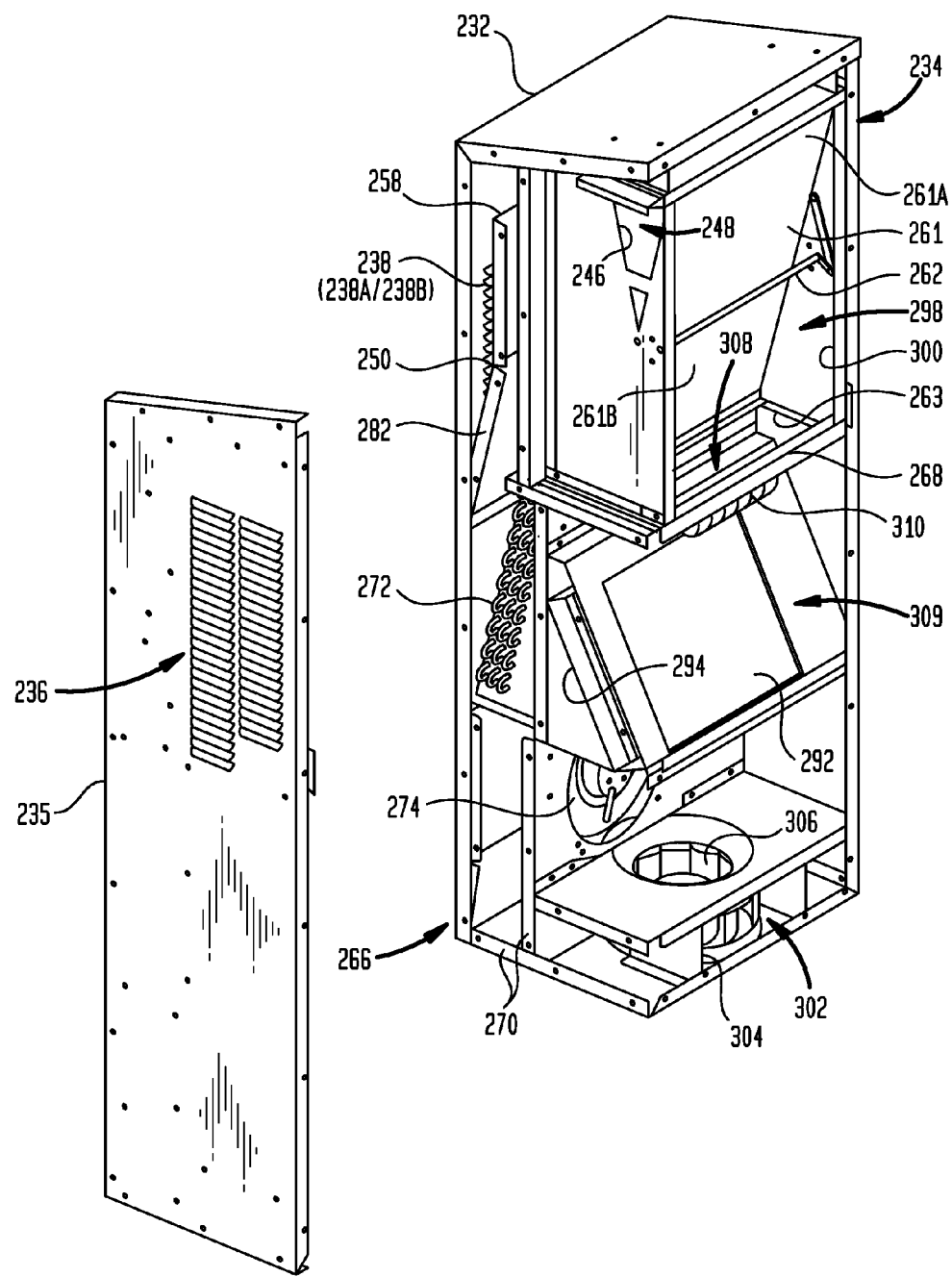
FIG. 16 is an exploded rear perspective view showing the temperature control unit of FIG. 13, with a side cover separated from the temperature control unit air handler assembly and a rear cover removed and not shown.

In FIG. 15, the butterfly damper 262 is positioned for fresh air operation, with the upper damper 261A angled forwardly and the lower damper 261B is angled rearwardly. In the fresh air position, the rearward positioning of the lower damper 261B exposes the air transfer opening 263 to the front side of the air handler assembly 134, allowing fresh air to pass downwardly and rearwardly through the temperature control unit 230, and ultimately enter the enclosure 2. At the same time, the forward positioning of the upper damper 261A exposes the side air vents 246 to the rear side of the air handler assembly, allowing warm air to exhaust from enclosure 2. As shown in FIG. 16, the damper 262 may also be positioned for air recirculation, with the upper damper 261A angled rearwardly and the lower damper 261B angled forwardly. In the air recirculation position, the forward positioning of the lower damper 261B exposes the air transfer opening 263 to the rear side of the air handler assembly 234, while the rearward positioning of the upper damper 261B blocks the side air vents. This allows air to recirculate through the temperature control unit 230, from the top to the bottom of the enclosure 2.

The space between the air filter 256 and the upper front wall 258 of the baffle plate unit 250 forms part of the air conditioning warm air vent pathway 254. Warm air is received into the pathway 254 from a mechanical air conditioning unit 266, which is a further structure of interest shown in FIGS. 14 and 15.

In the illustrated embodiment, the air conditioning unit 266 is not constructed as a modular assembly of the temperature control unit 230, but it could designed as a modular unit if so desired. The components that comprise the air conditioning unit 266 are situated below a bottom plate 268 of the air handler base unit 264, the bottom plate being the structure that defines the air transfer opening 263. As best shown in FIG. 15, the air conditioning components may be mounted to an inverted T-shaped support structure 270 of the air handler assembly 234. The support structure 270 mounts an air conditioning condenser coil unit (condenser) 272, an AC air mover 274, an air conditioning evaporator coil unit (evaporator) 276, and a variable speed air conditioning compressor 278 that is operably connected to pump a coolant (not shown) through a coolant loop that includes the condenser 272 and the evaporator 276.

The condenser 272, the AC air mover 274 and the compressor 278 are situated on the front side of the air conditioning unit 266. The condenser 272 sits adjacently below an angled lower front wall 282 of the baffle unit 250. The AC air mover 274 may be implemented as a radial blower fan. The inlet side of the AC air mover 274 lies within a short plenum 284 (FIG. 14) that is situated to receive fresh air from the outside air inlet 240 on the front cover 232. This is the inlet end of the air conditioning warm air vent pathway 254. The AC air mover 274 draws fresh air into this pathway and directs the air to an angled lower side 286 of the condenser 272. The fresh air passes through the condenser 272, where it is warmed by drawing off heat from the coolant within the condenser coils. The warm air exits an angled upper side 288 of the condenser 272, and flows upwardly along the inside of the baffle unit's angled lower front wall 282, entering the space between the air filter 256 and the upper front wall 258 of the baffle unit 250. The warm air then passes over the front side of the baffle unit's upper front wall 258 and lower front wall 282, and vents through the outside bidirectional air opening 238 in the front cover 232. This is the outlet end of the air conditioning warm air vent pathway 254.

As shown in FIG. 15, the evaporator 276 is situated on the rear side of the air conditioning unit 266, below the air transfer opening 263 of the air handler base unit 264. As will be described in more detail in connection with FIG. 16, the air transfer opening 263 directs air downwardly to an angled upper side 292 of the evaporator 276. The evaporator 276 pulls heat from this air, thereby cooling it, and the cooled air exits from an angled lower side 294 of the evaporator.

Turning now to FIG. 16, the rear side of the temperature control unit 230 is shown. In this view, the temperature control unit 230 is seen without a rear cover so as not to obscure any interior structure. An inside air inlet 298 of the temperature control unit 230 is provided by the large rectangular opening 300 at upper rear side of the air handler assembly 234. An inside air outlet 302 of the temperature control unit 230 is provided by a smaller rectangular opening 304 at the lower rear side of the air handler assembly 234. The opening 304 is at the outlet side of a primary air mover 306. The inlet side of the air mover 306 is situated below the evaporator unit 276.

The inside air inlet 298 is adapted to receive warm air from an upper portion of the equipment chamber 16. This air is warmed by heat given off from the equipment 70 within the equipment chamber 16. The warm air received at the inside air inlet 298 enters the area behind the butterfly damper 261. As noted above, the butterfly damper 261 is selectively positionable for different modes of operation. FIG. 16 shows the air recirculation position where the upper damper 261A is angled rearwardly to block the side air vents 246 and the lower damper 261B is angled forwardly to permit airflow from the inside air inlet 298 through the air transfer opening 263 to the lower end of the air handler assembly 234. This represents an interior air return pathway 308 whose upper end begins at the inside air inlet 298, flows through the air transfer opening 263, continues through the evaporator 276 and the air mover 306, and ends at the inside air outlet 300.

It will be seen in FIG. 16 that if the butterfly damper 262 was actuated to the fresh air position shown in FIG. 15, air entering the inside air inlet 298 would be blocked by the rearward position of the lower damper 261B from entering the air transfer opening 263, and would instead be permitted by the forward position of the upper damper 261A to flow through the side air vents 248 and the interior air exhaust pathway 248. At the same time, fresh air delivered via the fresh air inlet pathway 252 would be allowed to flow through the air transfer opening 263 and into the lower interior region of the air handler assembly 234. Insofar as this is the same lower interior region through which the interior air return pathway 308 flows, this region represents a merged common air pathway 309 that serves as a lower portion of both the fresh air inlet pathway 252 and the interior air return pathway 308.

The primary air mover 306 functions during all modes of operation. It moves air through the fresh air inlet pathway 252 and the interior air exhaust pathway 248 during fresh air operation. It moves air through the interior air return pathway 308 during air recirculation modes of operation. These operating modes may include strict air recirculation, or air recirculation combined with air conditioning or heating. Air conditioning is provided by the air conditioning unit 266. Heating is provided by a heater unit 310 that may be situated at any convenient location in the interior air return pathway 308, such as in the common air pathway 309 as shown in FIG. 16. The primary air mover 306 may be implemented as a radial blower fan. It may be conveniently mounted in a plenum 310 forming part of the lower end of the air handler assembly 234. The inlet of the primary air mover 306 is situated below the evaporator unit 276. As noted above, the outlet of the primary air mover 306 delivers air to the interior air outlet 302. It will be appreciated that the exposed side portion of the interior air return pathway 308 and the common air pathway 309 that are uncovered in FIG. 16 will be enclosed by the removed side cover 235 when it is mounted on the air handler assembly 234. Moreover, although not shown, the entire rear side of the temperature control unit 230 with the exception of the inside air inlet 298 and the inside air outlet will be enclosed by a suitable cover during use.

Figure 17:
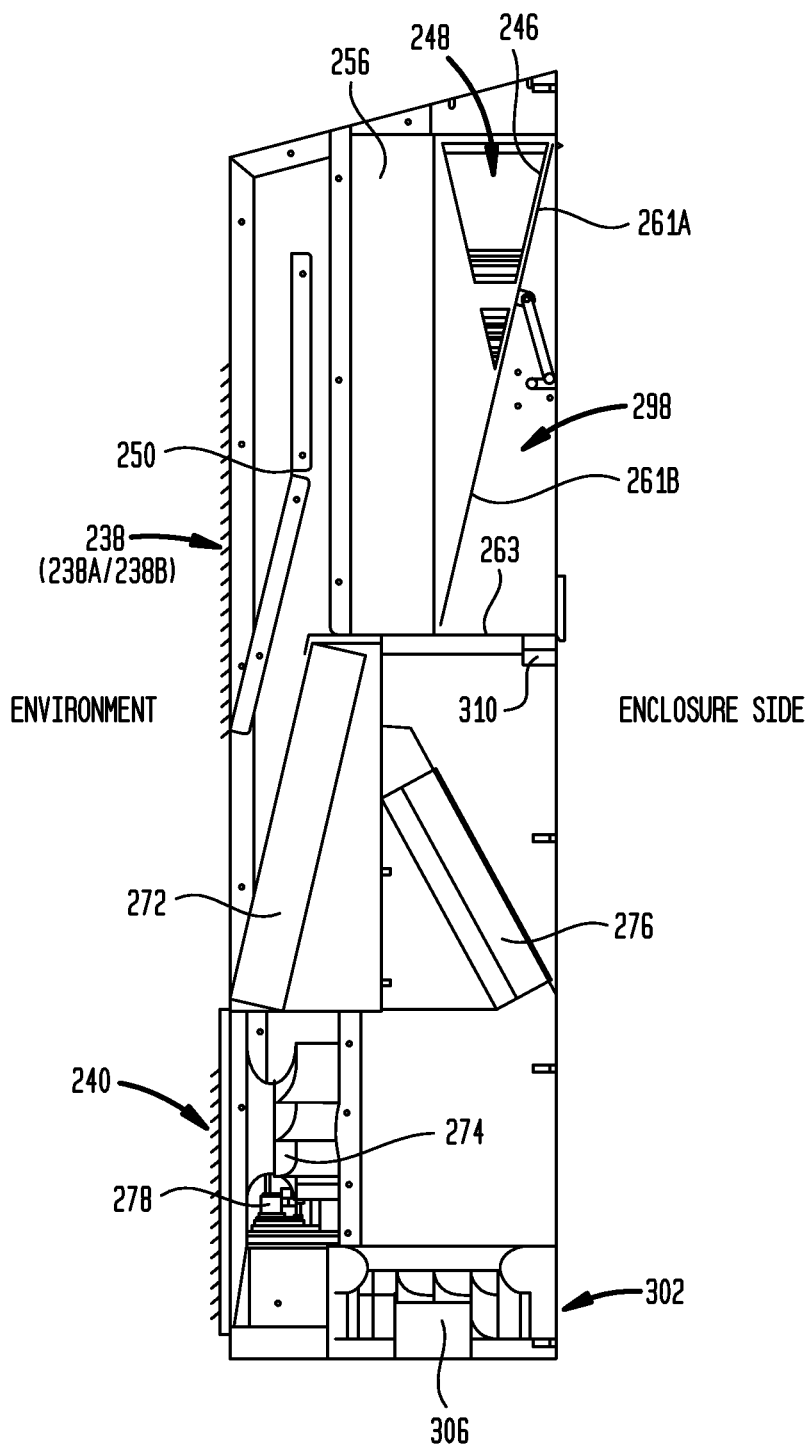
FIG. 17 is a cross-sectional centerline view showing the air handling and mechanical cooling components of FIGS. 13-16.

Turning now to FIG. 17, a cross-sectional centerline representation of the temperature control unit 230 is shown as a prelude to discussing various modes of operation that may be implemented by the control unit. The left hand side of FIG. 17 represents the ambient environment outside the temperature control unit 230, while the right hand side represents the enclosure side of the control unit. The temperature control components depicted in FIG. 17 include the air filter 56, the air conditioning condenser 272, the AC air mover 274, the air conditioning evaporator 276, the variable speed air conditioning compressor 278, the heater 310, the butterfly damper 261, the baffle unit 250, one of the side air vents 262, and the air transfer opening 263.

FIGS. 18A-18D are based on FIG. 17, and illustrate example operational modes of the temperature control unit 230. The orientation is as shown in FIG. 17, with the left hand side of each figure representing the ambient environment outside the temperature control unit 230, and the right hand side representing the enclosure side of the control unit.

In FIG. 18A, an air-conditioning mode of operation is shown. In this mode, the interior air return pathway 308 and the air conditioning warm air vent pathway 254 are utilized. The interior air return pathway 308 (including the portion thereof provided by the common air pathway 309) circulates air through the equipment chamber 16 in an internal loop, receiving warm air from the upper portion of the equipment chamber and returning cool conditioned air to the lower portion of the chamber. The air conditioning warm air vent pathway 254 circulates air through the air conditioning condenser 272 in an external loop, receiving cool outside air, passing it through the condenser to remove heat from the coolant therein, and expelling the warm air containing heat given off by the condenser back to the outside environment.

To implement the air-conditioning mode shown in FIG. 18A, the components of the temperature control unit 230 are placed in the following state:
 (1) the AC air mover 274 is in a power-on state;
 (2) the primary air mover 306 is in a power-on state;
 (3) the variable speed air conditioning compressor 278 is in a power-on state and operating at a selected speed;
 (4) the air heater 310 is in a power-off state;
 (5) the upper damper 261A is positioned to communicate air from the inside air inlet 298 to the interior air return pathway 308, while blocking air flow to the interior air exhaust pathway 248 (i.e., the upper damper 261A is angled rearwardly in FIG. 18A); and
 (6) the lower damper 261B is positioned to communicate air from the interior air return pathway 308 to the inside air outlet 302, while blocking air flow from the outside bidirectional air opening 238 (i.e., the lower damper 261B is angled forwardly in FIG. 18A).

In FIGS. 18B and 18C, a free-air-cooling mode of operation is shown. In this mode, the interior air exhaust pathway 248 and the fresh air inlet pathway 252 are utilized. The interior air exhaust pathway 248 receives warm air from the upper portion of the equipment chamber 16 and vents it out of the equipment enclosure 2 to the outside environment. The fresh air inlet pathway 252 (including the portion thereof provided by the common air pathway 309) receives cool outside air and delivers to the lower portion of the equipment chamber 16.

To implement the free-air-cooling mode shown in FIGS. 18B and 18C, the components of the temperature control unit 230 are placed in the following state:
 (1) the AC air mover 274 is in a power-off state;
 (2) the primary air mover 306 is in a power-on state;
 (3) the variable speed air conditioning compressor 278 is in a power-off state;
 (4) the air heater 310 is in a power-off state; and
 (5) the upper damper 261A is positioned to communicate air from the inside air inlet 298 through the interior air exhaust pathway 248 to the outside air outlet 236, while blocking air flow from the inside air inlet to the interior air return pathway 308 (i.e., the upper damper 261A is angled forwardly in FIGS. 18B and 18C); and
 (6) the lower damper 261B is positioned to communicate air from the outside bidirectional air opening 238 through the fresh air inlet pathway 252 to the inside air outlet 302, while blocking air flow from the inside air inlet 298 (i.e., the lower damper 261B is angled rearwardly in FIGS. 18B and 18C).

In FIG. 18D, a heating mode of operation is shown. In this mode, the interior air return pathway 308 is utilized. The interior air return pathway 308 (including the portion thereof provided by the common air pathway 309) receives warm air from the upper portion of the equipment chamber 16, passes the warm air through the air heater 310 for heating, then delivers the heated air to the lower portion of the equipment chamber 16.

To implement the heating mode shown in FIG. 18D, the components of the temperature control unit 230 are placed in the following state:
 (1) the AC air mover 274 is in a power-off state;
 (2) the primary air mover 306 is in a power-on state;
 (3) the variable speed air conditioning compressor 278 is in a power-off state;
 (4) the air heater 310 is in a power-on state;
 (5) the upper damper 261A is positioned to communicate air from the inside air inlet 298 to the interior air return pathway 308, while blocking air flow from the inside air inlet to the interior air exhaust pathway 248 (i.e., the upper damper 261A is angled rearwardly in FIG. 10D); and
 (6) the lower damper 261B is positioned to communicate air from the interior air return pathway 308 to the inside air outlet 302, while blocking air flow from the outside bidirectional air opening 238 (i.e., the lower damper 261B is angled forwardly in FIG. 18D).

It will be appreciated that the temperature control unit 230 may include the temperature controller 120 of FIG. 11, as well as the various temperature sensors 122, 124 and 126, to provide the required control functions. The control logic shown in FIGS. 12A-12C may also be used, with the exception of the emergency-free-air-cooling mode logic and the free-air-cooling-with-return mode logic. Those modes are not implemented by the temperature control unit 230 in its illustrated configuration (but could be added if desired).

Accordingly, an equipment enclosure with temperature control components, an equipment enclosure temperature control unit, an equipment enclosure temperature control method, and various modular temperature control subassemblies have been respectively disclosed for controlling the temperature of equipment in an equipment chamber. Although various embodiments have been described, it should be apparent that many variations and alternative embodiments could be implemented in accordance with the inventive concepts disclosed herein. It will therefore be understood that the invention is not to be in any way limited except in accordance with the spirit of the appended claims and their equivalents.

What is claimed is:

1. An equipment enclosure, comprising:
   a temperature-controlled equipment chamber for housing equipment in said equipment enclosure; and
   temperature control components that comprise:
   an inside air inlet arranged to receive air from said equipment chamber;
   an inside air outlet arranged to deliver air to said equipment chamber;
   said inside air inlet and said inside air outlet each being on an inside cover;
   a first outside air outlet arranged to deliver air to outside said equipment enclosure;
   a second outside air outlet arranged to deliver air to outside said equipment enclosure;
   a first outside air inlet arranged to receive air from outside said equipment enclosure;
   a second outside air inlet arranged to receive air from outside said equipment enclosure;
   said first outside air outlet, said second outside air outlet, said first outside air inlet and said second outside air inlet each being on an outside cover;
   an interior air exhaust pathway extending between said inside air inlet and said first outside air outlet for venting interior air in said interior equipment chamber to outside said enclosure;
   an interior air return pathway extending between said inside air inlet and said inside air outlet for recirculating interior air in said interior equipment chamber;
   a first controllable damper operable to selectively communicate air from said inside air inlet to said air exhaust pathway and said interior air return pathway;
   a fresh air inlet pathway extending between said first outside air inlet and said inside air outlet;
   a second controllable damper operable to selectively communicate air from said interior air return pathway and said fresh air inlet pathway to said inside air outlet;
   a primary air mover disposed to move air through said interior air return pathway and said fresh air inlet pathway;
   an air heater in said interior air return pathway;
   an air conditioning evaporator in said interior air return pathway;
   an air conditioning warm air vent pathway extending between said second outside air inlet and said second outside air outlet;
   an air conditioning condenser in said air conditioning warm air vent pathway;
   a variable speed air conditioning compressor operably connected to pump a coolant through a coolant loop that includes said air conditioning condenser and air conditioning evaporator;
   an air conditioning air mover disposed to move air through said air conditioning warm air vent pathway;
   upper and low temperature sensors for sensing temperature in upper and lower portions of said equipment chamber;
   an outside air temperature sensor for sensing outside air temperature; and
   a temperature controller operable to control said dampers, said air movers and said air conditioning compressor based on temperature readings provided by said temperature sensors.

2. The equipment enclosure of claim 1, wherein said first outside air inlet and said second outside air outlet comprise an outside bidirectional air opening arranged to deliver air to and receive air from outside said equipment enclosure.

3. The equipment enclosure of claim 1, further including:
   an emergency fresh air pathway extending between said second outside air inlet and said inside air outlet, said emergency pathway including said air conditioning air mover; and
   a controllable emergency damper operable to selectively communicate air from said second outside air inlet to said air conditioning warm air vent pathway and said emergency fresh air pathway.

4. The equipment enclosure of claim 1, wherein said interior air return pathway and said fresh air inlet pathway are merged to form a common air pathway between said second controllable damper and said inside air outlet.

5. The equipment enclosure of claim 1, wherein said temperature control components are embodied in a temperature control unit mounted on a wall of said equipment enclosure.

6. The equipment enclosure of claim 5, wherein said temperature control unit comprises a modular air conditioning unit that is selectively attachable to a modular temperature control unit air handler assembly.

7. The equipment enclosure of claim 6, wherein:
   said modular air conditioning unit comprises said air conditioning evaporator, said air conditioning condenser, said variable speed air conditioning compressor, said air conditioning air mover, a portion of said air conditioning warm air vent pathway, and a portion of said interior air return pathway;
   said modular air handler assembly comprises a portion of said interior air return pathway, said first controllable damper, said fresh air inlet pathway, said second controllable damper, said primary air mover, said air heater, and a portion of said air conditioning warm air vent pathway;
   and further wherein:
   said inside air inlet and said inside air outlet comprise an inside cover on said air handler assembly; and
   said first and second outside air outlets and said first and second outside air inlets comprise an outside cover on said air handler assembly.

8. The equipment enclosure of claim 1, wherein said temperature controller is programmed to operate said temperature control unit in a first mode, representing an air-conditioning mode, wherein:
   said primary air mover is in a power-on state;
   said air conditioning air mover is in a power-on state;
   said air conditioning compressor is in a power-on state and operating at a selected speed;
   said air heater is in a power-off state;
   said first controllable damper is positioned to communicate air from said inside air inlet to said interior air return pathway;

said second controllable damper is positioned to communicate air from said interior air return pathway to said inside air outlet, while blocking air flow from said first outside air inlet; and
air flows from said second outside air inlet through said air conditioning warm air vent pathway to said second outside air outlet.

9. The equipment enclosure of claim 1, wherein said temperature controller is programmed to operate said temperature control unit in a second mode, representing a free-air-cooling mode, wherein:
said primary air mover is in a power-on state;
said air conditioning air mover is in a power-off state;
said air conditioning compressor is in a power-off state;
said air heater is in a power-off state;
said first controllable damper is positioned to communicate air from said inside air inlet through said interior air exhaust pathway to said first outside air outlet, while blocking air flow from said inside air inlet into said interior air return pathway; and
said second controllable damper is positioned to communicate air from said first outside air inlet through said fresh air inlet pathway to said inside air outlet, while blocking air flow from said inside air inlet.

10. The equipment enclosure of claim 1, wherein said temperature controller is programmed to operate said temperature control unit in a third mode, representing a free-air-cooling-with-return mode, wherein:
said primary air mover is in a power-on state;
said air conditioning air mover is in a power-off state;
said air conditioning compressor is in a power-off state;
said air heater is in a power-off state;
said first controllable damper is positioned to communicate air from said inside air inlet through said interior air exhaust pathway to said first outside air outlet, while also allowing air flow from said inside air inlet into said interior air return pathway; and
said second controllable damper is positioned to communicate air from said first outside air inlet through said fresh air inlet pathway to said inside air outlet, while also allowing air flow from said inside air inlet through said interior air return pathway to said inside air outlet.

11. The equipment enclosure of claim 1, wherein said temperature controller is programmed to operate said temperature control unit in a fourth mode, representing a heating mode, wherein:
said primary air mover is in a power-on state;
said air conditioning air mover is in a power-off state;
said air conditioning compressor is in a power-off state;
said air heater is in a power-on state;
said first controllable damper is positioned to communicate air from said inside air inlet to said interior air return pathway, while blocking air flow from said inside air inlet to said interior air exhaust pathway; and
said second controllable damper is positioned to communicate air from said interior air return pathway to said inside air outlet, while blocking air flow from said first outside air inlet.

12. The equipment enclosure of claim 3, wherein said control electronics is programmed to operate said temperature control unit in a fifth mode, representing an emergency-free-air-cooling mode, wherein:
said primary air mover is in a power-off state;
said air conditioning air mover is in a power-on state;
said air conditioning compressor is in a power-off state;
said air heater is in a power-off state;
said first controllable damper is positioned to communicate air from said inside air inlet through said interior air exhaust pathway to said first outside air outlet, while blocking air flow from said inside air inlet into said interior air return pathway;
said second controllable damper is positioned to block air flow from said first outside air inlet; and
said emergency damper is positioned to allow air flow through said emergency air pathway, while blocking said air conditioning warm air vent pathway.

13. A temperature control unit adapted for use with an equipment enclosure requiring a temperature-controlled equipment chamber for housing equipment in said enclosure, said temperature control unit comprising:
an inside air inlet arranged to receive air from said equipment chamber;
an inside air outlet arranged to deliver air to said equipment chamber;
said inside air inlet and said inside air outlet each being on an inside cover;
a first outside air outlet arranged to deliver air to outside said equipment enclosure;
a second outside air outlet arranged to deliver air to outside said equipment enclosure;
a first outside air inlet arranged to receive air from outside said equipment enclosure;
a second outside air inlet arranged to receive air from outside said equipment enclosure;
said first outside air outlet, said second outside air outlet, said first outside air inlet and said second outside air inlet each being on an outside cover;
an interior air exhaust pathway extending between said inside air inlet and said first outside air outlet for venting interior air in said interior equipment chamber to outside said enclosure;
an interior air return pathway extending between said inside air inlet and said inside air outlet for recirculating interior air in said interior equipment chamber;
a first controllable damper operable to selectively communicate air from said inside air inlet to said air exhaust pathway and said interior air return pathway;
a fresh air inlet pathway extending between said first outside air inlet and said inside air outlet;
a second controllable damper operable to selectively communicate air from said interior air return pathway and said fresh air inlet pathway to said inside air outlet;
a primary air mover disposed to move air through said interior air return pathway and said fresh air inlet pathway;
an air heater in said interior air return pathway;
an air conditioning evaporator in said interior air return pathway;
an air conditioning warm air vent pathway extending between said second outside air inlet and said second outside air outlet;
an air conditioning condenser in said air conditioning warm air vent pathway;
a variable speed air conditioning compressor operably connected to pump a coolant through a coolant loop that includes said air conditioning condenser and air conditioning evaporator;
an air conditioning air mover disposed to move air through said air conditioning warm air vent pathway;
upper and low temperature sensors for sensing temperature in upper and lower portions of said equipment chamber;

an outside air temperature sensor for sensing outside air temperature; and a temperature controller operable to control said dampers, said air movers and said air conditioning compressor based on temperature readings provided by said temperature sensors.

14. The temperature control unit of claim 13, wherein said first outside air inlet and said second outside air outlet comprise an outside bidirectional air opening arranged to deliver air to and receive air from outside said equipment enclosure.

15. The temperature control unit of claim 13, further including:
an emergency fresh air pathway extending between said second outside air inlet and said inside air outlet, said emergency pathway including said air conditioning air mover; and
a controllable emergency damper operable to selectively communicate air from said second outside air inlet to said air conditioning warm air vent pathway and said emergency fresh air pathway.

16. The temperature control unit of claim 13, wherein said interior air return pathway and said fresh air inlet pathway are merged to form a common air pathway between said second controllable damper and said inside air outlet.

17. The temperature control unit of claim 13, wherein said temperature control unit configured for mounting on a wall or door of said equipment enclosure.

18. The temperature control unit of claim 13, wherein said temperature control unit comprises a modular air conditioning unit that is selectively attachable to a modular temperature control unit air handler assembly.

19. The temperature control unit of claim 18, wherein:
said modular air conditioning unit comprises said air conditioning evaporator, said air conditioning condenser, said variable speed air conditioning compressor, said air conditioning air mover, a portion of said air conditioning warm air vent pathway, and a portion of said interior air return pathway;
said modular air-handler assembly comprises a portion of said interior air return pathway, said first controllable damper, said fresh air inlet pathway, said second controllable damper, said primary air mover, said air heater, and a portion of said air conditioning warm air vent pathway;
and further wherein:
said inside air inlet and said inside air outlet comprise an inside cover on said air handler assembly; and
said first and second outside air outlets and said first and second outside air inlets comprise an outside cover on said air handler assembly.

20. The temperature control unit of claim 13, wherein said temperature controller is programmed to operate said temperature control unit in a first mode, representing an air-conditioning mode, wherein:
said primary air mover is in a power-on state;
said air conditioning air mover is in a power-on state;
said air conditioning compressor is in a power-on state and operating at a selected speed;
said air heater is in a power-off state;
said first controllable damper is positioned to communicate air from said inside air inlet to said interior air return pathway;
said second controllable damper is positioned to communicate air from said interior air return pathway to said inside air outlet, while blocking air flow from said first outside air inlet; and air flows from said second outside air inlet through said air conditioning warm air vent pathway to said second outside air outlet.

21. The temperature control unit of claim 13, wherein said temperature controller is programmed to operate said temperature control unit in a second mode, representing a free-air-cooling mode, wherein:
said primary air mover is in a power-on state;
said air conditioning air mover is in a power-off state;
said air conditioning compressor is in a power-off state;
said air heater is in a power-off state;
said first controllable damper is positioned to communicate air from said inside air inlet through said interior air exhaust pathway to said first outside air outlet, while blocking air flow from said inside air inlet into said interior air return pathway; and
said second controllable damper is positioned to communicate air from said first outside air inlet through said fresh air inlet pathway to said inside air outlet, while blocking air flow from said inside air inlet.

22. The temperature control unit of claim 13, wherein said temperature controller is programmed to operate said temperature control unit in a third mode, representing a free-air-cooling-with-return mode, wherein:
said primary air mover is in a power-on state;
said air conditioning air mover is in a power-off state;
said air conditioning compressor is in a power-off state;
said air heater is in a power-off state;
said first controllable damper is positioned to communicate air from said inside air inlet through said interior air exhaust pathway to said first outside air outlet, while also allowing air flow from said inside air inlet into said interior air return pathway; and
said second controllable damper is positioned to communicate air from said first outside air inlet through said fresh air inlet pathway to said inside air outlet, while also allowing air flow from said inside air inlet through said interior air return pathway to said inside air outlet.

23. The temperature control unit of claim 13, wherein said temperature controller is programmed to operate said temperature control unit in a fourth mode, representing a heating mode, wherein:
said primary air mover is in a power-on state;
said air conditioning air mover is in a power-off state;
said air conditioning compressor is in a power-off state;
said air heater is in a power-on state;
said first controllable damper is positioned to communicate air from said inside air inlet to said interior air return pathway, while blocking air flow from said inside air inlet to said interior air exhaust pathway;
said second controllable damper is positioned to communicate air from said interior air return pathway to said inside air outlet, while blocking air flow from said first outside air inlet.

24. The temperature control unit of claim 15, wherein said temperature controller is programmed to operate said temperature control unit in a fifth mode, representing an emergency-free-air-cooling mode, wherein:
said primary air mover is in a power-off state;
said air conditioning air mover is in a power-on state;
said air conditioning compressor is in a power-off state;
said air heater is in a power-off state;
said first controllable damper is positioned to communicate air from said inside air inlet through said interior air exhaust pathway to said first outside air outlet, while blocking air flow from said inside air inlet into said interior air return pathway;

said second controllable damper is positioned to block air flow from said first outside air inlet; and said emergency damper is positioned to allow air flow through said emergency fresh air pathway, while blocking said air conditioning warm air vent pathway.

* * * * *